(12) United States Patent
Baek et al.

(10) Patent No.: US 10,127,997 B2
(45) Date of Patent: Nov. 13, 2018

(54) DATA STORAGE DEVICE COMPRISING SUPER BLOCK PARITY DATA BASED ON PAGE TYPE OF WORD LINE OR PLANE

(71) Applicant: SK hynix Inc., Gyeonggi-do (KR)

(72) Inventors: Seung Geol Baek, Gyeonggi-do (KR); Seung Hwan Kim, Gyeonggi-do (KR); Jong Hee Han, Gyeonggi-do (KR); Duck Hoi Koo, Gyeonggi-do (KR); Ik Joon Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 44 days.

(21) Appl. No.: 14/979,965

(22) Filed: Dec. 28, 2015

(65) Prior Publication Data
US 2017/0031751 A1   Feb. 2, 2017

(30) Foreign Application Priority Data
Jul. 31, 2015 (KR) .......... 10-2015-0108642

(51) Int. Cl.
*G06F 11/10* (2006.01)
*G11C 29/52* (2006.01)
*G06F 3/06* (2006.01)
*G11C 29/04* (2006.01)

(52) U.S. Cl.
CPC .......... *G11C 29/52* (2013.01); *G06F 3/065* (2013.01); *G06F 3/0619* (2013.01); *G06F 3/0655* (2013.01); *G06F 3/0688* (2013.01); *G06F 11/108* (2013.01); *G06F 11/1076* (2013.01); *G06F 3/0614* (2013.01); *G06F 11/1068* (2013.01); *G06F 11/1072* (2013.01); *G11C 2029/0411* (2013.01)

(58) Field of Classification Search
CPC .......... G06F 11/1076; G06F 11/1008; G06F 11/1032; G06F 11/1036; G06F 11/1044; G06F 11/1068; G06F 11/1072; G06F 11/108; G06F 3/0614
See application file for complete search history.

(56) References Cited

U.S. PATENT DOCUMENTS

| 6,289,471 B1* | 9/2001 | Gordon | G06F 11/1008 714/6.12 |
|---|---|---|---|
| 6,351,838 B1* | 2/2002 | Amelia | G06F 11/1076 711/114 |
| 9,396,062 B1* | 7/2016 | Sridhara | G06F 11/10 |
| 2002/0194526 A1* | 12/2002 | Ulrich | G06F 3/061 714/6.12 |
| 2006/0245290 A1* | 11/2006 | Han | G11C 8/08 365/230.03 |
| 2010/0122022 A1* | 5/2010 | Luo | G06F 11/1068 711/103 |
| 2012/0011337 A1* | 1/2012 | Aizman | G06F 11/1076 711/162 |

(Continued)

FOREIGN PATENT DOCUMENTS

| KR | 1020130097995 | 9/2013 |
|---|---|---|
| KR | 1020140046064 | 4/2014 |

*Primary Examiner* — Joseph O Schell
(74) *Attorney, Agent, or Firm* — IP & T Group LLP

(57) ABSTRACT

A data storage device may include a plurality of nonvolatile memory devices including a plurality of blocks and a controller suitable for generating super block parity data for a super block, which is formed of one or more of the plurality of blocks.

15 Claims, 16 Drawing Sheets

(56) References Cited

U.S. PATENT DOCUMENTS

| | | | |
|---|---|---|---|
| 2012/0185738 A1* | 7/2012 | Gyllenskog | G06F 11/1044 |
| | | | 714/54 |
| 2013/0039129 A1* | 2/2013 | Radke | G11C 16/0483 |
| | | | 365/185.09 |
| 2015/0019933 A1* | 1/2015 | Yamazaki | G06F 11/108 |
| | | | 714/758 |
| 2016/0179614 A1* | 6/2016 | Camp | G06F 11/1012 |
| | | | 714/766 |
| 2016/0350185 A1* | 12/2016 | Hong | G06F 3/0619 |

* cited by examiner

DATA STORAGE DEVICE COMPRISING SUPER BLOCK PARITY DATA BASED ON PAGE TYPE OF WORD LINE OR PLANE

CROSS-REFERENCES TO RELATED APPLICATION

The present application claims priority under 35 U.S.C. § 119(a) to Korean application number 10-2015-0108642 filed on Jul. 31, 2015, in the Korean Intellectual Property Office, which is Incorporated herein by reference in its entirety.

BACKGROUND

1. Technical Field

Various embodiments generally relate to a data storage device, and, more particularly, to a data storage device capable of correcting an error bit.

2. Related Art

A data storage device stores data that is provided from an external device in response to a write request from the external device. The data storage device also provides the external device with stored data in response to a read request from the external device. The external device is an electronic device capable of processing data, and may include a computer, a digital camera, a cellular phone and the like. The data storage device may be embedded in the external device, or may be fabricated separately and then coupled to the external device.

SUMMARY

In an embodiment, a data storage device may include a plurality of nonvolatile memory devices including a plurality of blocks; and a controller suitable for generating super block parity data for a super block, which is formed of one or more of the plurality of blocks.

In an embodiment, a data storage device may include a plurality of nonvolatile memory devices including a plurality of blocks; and a controller suitable for storing a plurality of data chunks in a super block including blocks of the same block offset among the plurality of blocks, and generating super block parity data for the plurality of data chunks.

In an embodiment, a method for operating a data storage device including a plurality of nonvolatile memory devices may include storing a plurality of data chunks in a super block including blocks of the same block offset among a plurality of blocks included in the plurality of nonvolatile memory devices; and generating super block parity data for the plurality of data chunks.

DETAILED DESCRIPTION

Figure 1:
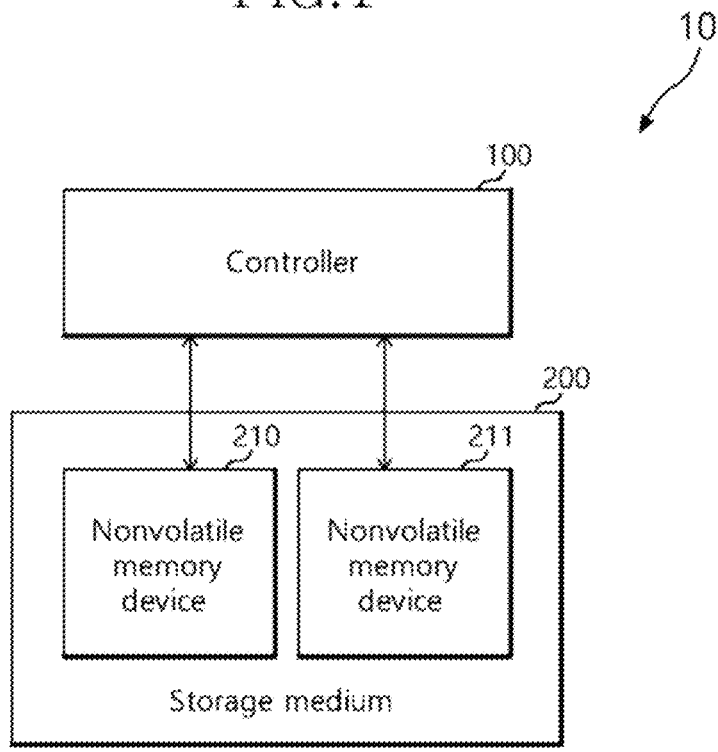
FIG. 1 is a block diagram illustrating a data storage device in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

FIG. 1 is a block diagram illustrating a data storage device 10 in accordance with an embodiment.

The data storage device 10 may include a controller 100 and a storage medium 200.

The data storage device 10 may be configured by a Personal Computer Memory Card International Association (PCMCIA) card, a compact flash (CF) card, a smart media card, a memory stick, a multimedia card (MMC), an embedded MMC (eMMC), a reduced-size multimedia card (RS-MMC) and a micro-size version of MMC (MMC-micro), a secure digital (SD) card, a mini secure digital (mini-SD) and a micro secure digital (micro-SD), a universal flash storage (UFS), and/or a solid state drive (SSD).

The controller 100 may control the general operations of the data storage device 10. The controller 100 may store data in the storage medium 200 in response to a write request transmitted from an external device, and may read data stored in the storage medium 200 and output the read data to the external device in response to a read request transmitted from the external device. To store/read data, the controller 100 may access nonvolatile memory devices 210 and 211 included in the storage medium 200 according to an interleaving scheme.

The controller 100 may store a plurality of data chunks in a super block which includes blocks having the same block offset among the plurality of blocks included in the nonvolatile memory devices 210 and 211, and may store super block parity data generated for the plurality of data chunks in a parity region included in the storage medium 200.

According to an embodiment, the controller 100 may classify a plurality of data chunks for the super block into a plurality of data groups according to the attributes of target regions, in which the plurality of data chunks are to be stored. The controller 100 may generate super block parity data for the plurality of respective data groups. The controller 100 may generate super block parity data for each super block formed in the nonvolatile memory devices 210 and 211. Because the controller 100 generates super block parity data for each super block, the super block parity data occupies smaller storage space than parity data for a memory region smaller than the super block (e.g., a stripe including pages of the same page offset in the super block). Accordingly, space utilization efficiency may be improved.

According to an embodiment, when reading a first data chunk of a first data group among the plurality of data chunks stored in a super block and it is determined that an error has occurred in the first data chunk or it is determined that the error of the first data chunk cannot be corrected by the error correction code (ECC) algorithm of an ECC unit (not shown), the controller 100 may read all the data chunks of the first data group other than the first data chunk and the super block parity data generated for the first data group from the storage medium 200. The controller 100 may correct the first chunk data having the error based on the other data chunks of the first data group and the super block parity data. In other words, through the super block parity data, the controller 100 may correct an error of the stored data. Accordingly, the reliability of data may be improved.

According to an embodiment, the controller 100 may store a plurality of data chunks in the stripe which includes pages having the same page offset among the plurality of pages included in each super block, and may store stripe parity data generated for the stripe in a parity region included in the storage medium 200.

The storage medium 200 may include the nonvolatile memory devices 210 and 211.

The nonvolatile memory apparatus may include flash memory devices such as NAND flash or NOR flash, Ferroelectrics Random Access Memory (FeRAM), Phase-Change Random Access Memory (PCRAM), Magnetoresistive Random Access Memory (MRAM) Resistive Random Access Memory (ReRAM), etc.

Each of the nonvolatile memory devices 210 and 211 may store the data chunk transmitted from the controller 100, may read the data chunk stored therein and transmit the read data chunk to the controller 100 under the control of the controller 100.

While FIG. 1 shows the storage medium 200 including the two nonvolatile memory devices 210 and 211, it is to be noted that the number of the nonvolatile memory devices included in the storage medium 200 is not limited to such.

Figure 2:
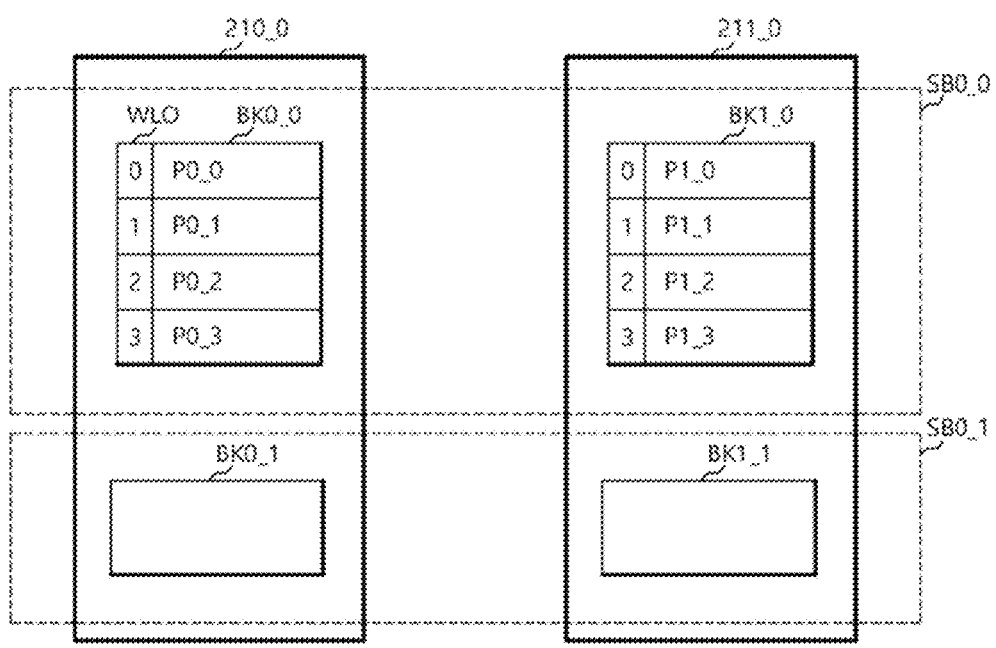
FIG. 2 is a diagram illustrating memory regions of nonvolatile memory devices shown in FIG. 1.

FIG. 2 is a diagram illustrating memory regions of embodiments 210_0 and 211_0 of the nonvolatile memory devices 210 and 211 shown in FIG. 1.

Each of the nonvolatile memory devices 210_0 and 211_0 may include a plurality of blocks. For example, the nonvolatile memory device 210_0 may include blocks BK0_0 and BK0_1. In the nonvolatile memory devices 210_0 and 211_0, each block may have a predetermined block offset. For example, in the nonvolatile memory device 210_0, the block offset of the block BK0_0 may be "0", and the block offset of the block BK0_1 may be "1".

Each block may include a plurality of pages. For example, the block BK0_0 may include pages P0_0 to P0_3. In each block, each page may have a predetermined page offset. For example, in the block BK0_0, the page offset of the page P0_0 may be "0", the page offset of the page P0_1 may be "1", the page offset of the page P0_2 may be "2", and the page offset of the page P0_3 may be "3". In the present embodiment, a data chunk refers to the unit of data to be stored in a page. Respective data chunks may be stored in different pages.

Each page may be accessed as a corresponding word line is enabled. When a memory cell electrically coupled to a word line is a single level cell (SLC), a single page may correspond to a single word line. For example, in the block BK0_0, the page P0_0 may correspond to a word line with the word line offset WLO of "0", the page P0_1 may correspond to a word line with the word line offset WLO of "1", the page P0_2 may correspond to a word line with the word line offset WLO of "2", and the page P0_3 may correspond to a word line with the word line offset WLO of "3". In each block, while respective word lines may have word line offsets WLO according to order in which they are disposed, it is to be noted that the embodiment is not limited to such.

Super blocks SB0_0 and SB0_1 may be formed in the nonvolatile memory devices 210_0 and 211_0. Each of the super blocks SB0_0 and SB0_1 may include blocks of the same block offset in the nonvolatile memory devices 210_0 and 211_0. For example, the super block SB0_0 may include blocks BK0_0 and BK1_0 which have the block offset of "0" in the respective nonvolatile memory devices 210_0 and 211_0. The super block SB0_1 may include blocks BK0_1 and BK1_1 which have the block offset of "1" In the respective nonvolatile memory devices 210_0 and 211_0.

In the memory structures shown in FIG. 2, respective pages may have attributes which are distinguished from one another. The attributes of a page may include, for example, a block offset, a page offset and a word line offset. For example, the attributes of the page P0_0 may include the block offset "0" of the block BK0_0, the page offset "0" thereof, and the word line offset "0" of a word line which corresponds to the page P0_0. The attributes of pages may serve as references for classifying a plurality of data chunks into a plurality of data groups.

According to an embodiment, in order to classify a plurality of data chunks into a plurality of data groups, other references besides the block offset, page offset and word line offset described above may be referred to.

The number of the blocks, the number of the word lines and the number of the pages shown in FIG. 2 are for illustrative purposes only, and it is to be noted that the embodiment is not limited to such.

Figure 3:
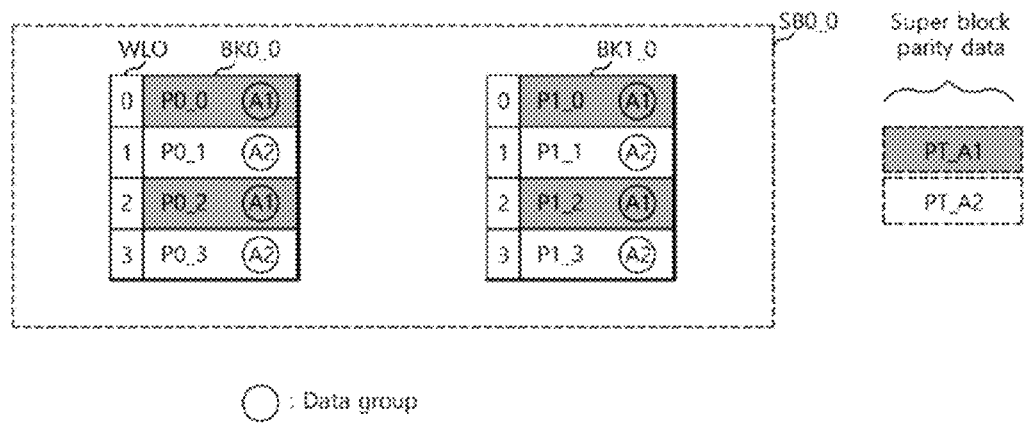
FIG. 3 is a diagram illustrating a method of the data storage device for generating super block parity data for the memory regions shown in FIG. 2.

FIG. 3 is a diagram illustrating a method of the data storage device 10 for generating the super block parity data for the memory regions shown in FIG. 2. FIG. 3 illustrates super block parity data PT_A1 and PT_A2 generated for data chunks to be stored in the super block SB0_0 of FIG. 2.

For example, the controller 100 may classify data chunks of the super block SB0_0 into data groups A1 and A2 according to a word line offset corresponding to a page in which a data chunk is to be stored. The controller 100 may classify data chunks that are to be stored in pages corresponding to word lines of even or odd word line offset into the same data group in the super block SB0_0. For example, in the respective blocks BK0_0 and BK1_0, the controller 100 may classify data chunks to be stored in the pages P0_0, P0_2, P1_0 and P1_2 corresponding to word lines having even word line offsets (i.e., even-numbered word lines) into the data group A1, and may classify data chunks to be stored in the pages P0_1, P0_3, P1_1 and P1_3 corresponding to word lines having odd word line offsets (i.e., odd-numbered word lines) into the data group A2. Zero (0) is defined as being even herein. Table 1 below schematically shows a reference by which data chunks are classified into the data groups A1 and A2 in the super block SB0_0 according to a word line offset corresponding to a page in which a data chunk is to be stored.

TABLE 1

| Word line offset | Data group |
|---|---|
| Even | A1 |
| Odd | A2 |

The controller 100 may generate the super block parity data PT_A1 and PT_A2 for the data groups A1 and A2, respectively. For example, the controller 100 may generate the super block parity data PT_A1 for the data chunks classified into the data group A1. The controller 100 may store data chunks in the super block SB0_0, and may store the super block parity data PT_A1 and PT_A2 in a parity region predetermined in the storage medium 200.

According to an embodiment, the parity region in which the super block parity data PT_A1 and PT_A2 are to be stored may be separated from the super block SB0_0 in the storage medium 200. The parity region may be included in another nonvolatile memory device (not shown) of the storage medium 200 other than the nonvolatile memory devices 210_0 and 211_0. In one embodiment, the parity region may be included in the super block SB0_0. The parity region may be the last pages P0_3 and P1_3 in the super block SB0_0. In this case, the super block parity data PT_A1 may be generated for data chunks to be stored in the pages P0_0, P0_2, P1_0 and P1_2, and the super block parity data PT_A2 may be generated for data chunks to be stored in the pages P0_1 and P1_1.

After the data chunks are stored in the super block SB0_0, in the case where an error bit occurs in the data chunk stored in, for example, the page P0_0, it may be highly likely for an error bit to occur in even the data chunk stored in the page P0_1 due to the structural characteristic of a nonvolatile memory device. In other words, the data chunks stored in the pages P0_0 and P0_1 corresponding to adjacent word lines may be influenced by each other and may simultaneously include error bits. However, as shown in FIG. 3, when the super block parity data PT_A1 and PT_A2 for the respective data groups A1 and A2 exist, the error bit occurring in the data chunk stored in the page P0_0 may be corrected by using the other remaining data chunks included in the data group A1 and the super block parity data PT_A1, and the error bit occurring in the data chunk stored in the page P0_1 may be corrected by using the other remaining data chunks included in the data group A2 and the super block parity data PT_A2.

In summary, in order to correct error bits which occur in pages corresponding to adjacent word lines, data chunks to be stored in the pages corresponding to the adjacent word lines may be classified into different data groups. According to an embodiment, in each block, the controller 100 may classify data chunks into a plurality of data groups in a manner such that data chunks to be stored in pages corresponding to adjacent word lines are classified into different data groups. In each block, the controller 100 may classify data chunks corresponding to even-numbered or odd-numbered word lines into the same data group. For example, in each block, when the controller 100 classifies data chunks corresponding to word lines separated by "k" (k is a natural number) number of word lines into the same data group, the controller 100 may classify data chunks to be stored in a single super block into "k+1" number of data groups, and may generate "k+1" number of super block parity data respectively corresponding to the data groups.

Figure 4:
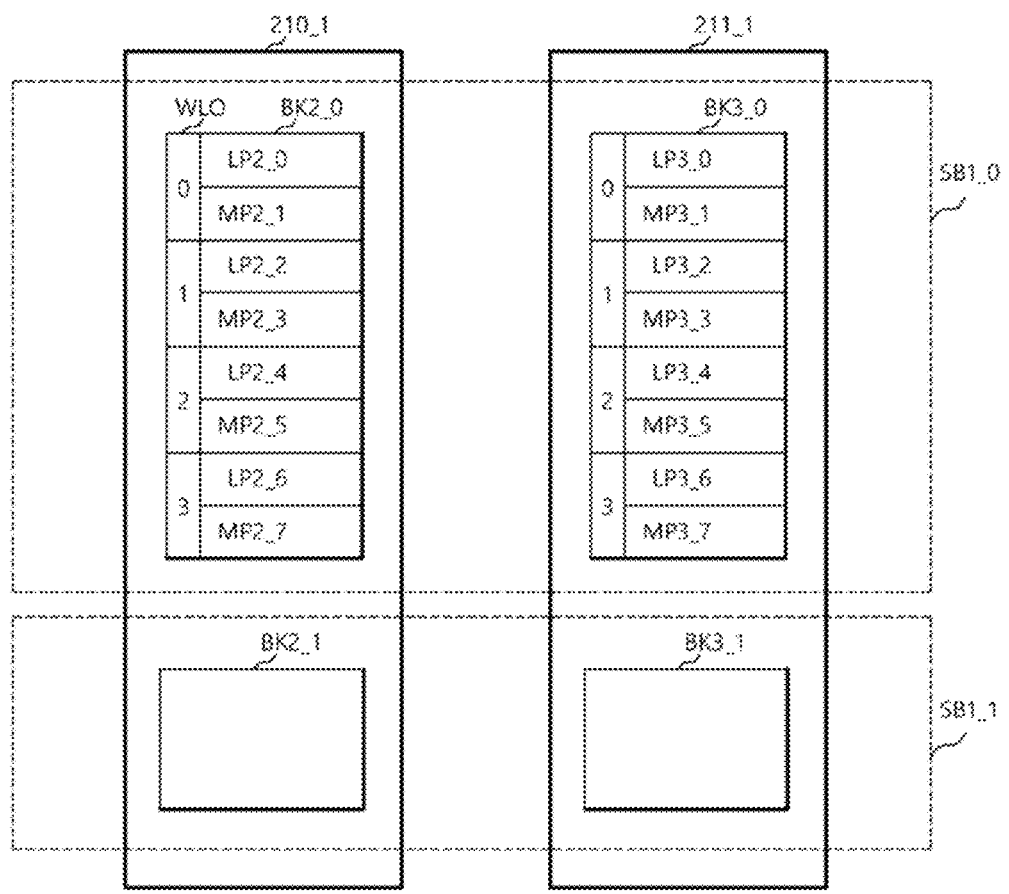
FIG. 4 is a diagram illustrating memory regions of nonvolatile memory devices shown in FIG. 1.

FIG. 4 is a diagram illustrating memory regions of embodiments 210_1 and 211_1 of the nonvolatile memory devices 210 and 211 shown in FIG. 1.

The nonvolatile memory devices 210_1 and 211_1 may be configured substantially similarly to the nonvolatile memory devices 210_0 and 211_0 shown in FIG. 2 except that each memory cell is a multi-level cell (MLC) in which two bits are stored.

Referring to FIG. 4, when each memory cell is a MLC, two pages may correspond to a single word line. For example, in block BK2_0, pages LP2_0 and MP2_1 may correspond to a word line with the word line offset WLO of "0", pages LP2_2 and MP2_3 may correspond to a word line with the word line offset WLO of "1", pages LP2_4 and MP2_5 may correspond to a word line with the word line offset WLO of "2", and pages LP2_6 and MP2_7 may correspond to a word line with the word line offset WLO of "3".

Pages corresponding together to a single word line may be classified into different types of pages (e.g., an LSB (least significant bit) page and an MSB (most significant bit) page) according to which bit between bits is to be stored in a page. In detail, a page in which LSB data is to be stored may be an LSB page, and a page in which MSB data is to be stored may be an MSB page. Between two pages corresponding together to a single word line, a page of the even page offset may be an LSB page, and a page of the odd page offset may be an MSB page. For example, in the block BK2_0, the page LP2_0 may be the LSB page, and the page MP2_1 may be the MSB page.

According to an embodiment, at least 3-bit data may be stored in each memory cell. In the case where a plurality of bits, for example, "n" number of bits are stored in each memory cell, "n" number of different page types may exist.

Figure 5:
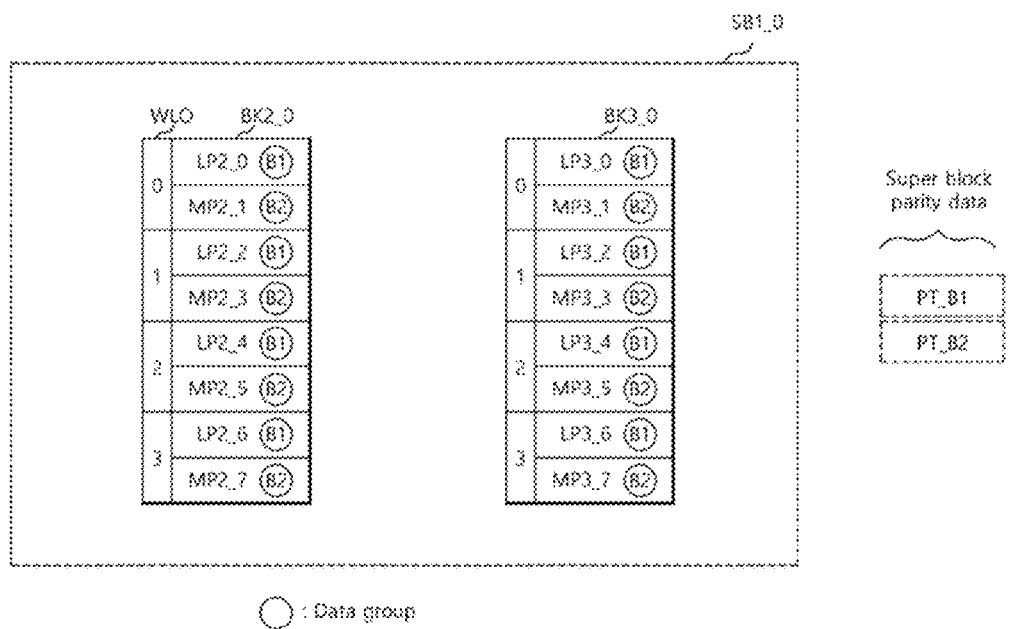
FIGS. 5 and 6 are diagrams illustrating methods of the data storage device for generating super block parity data for the memory regions shown in FIG. 4.
Figure 6:
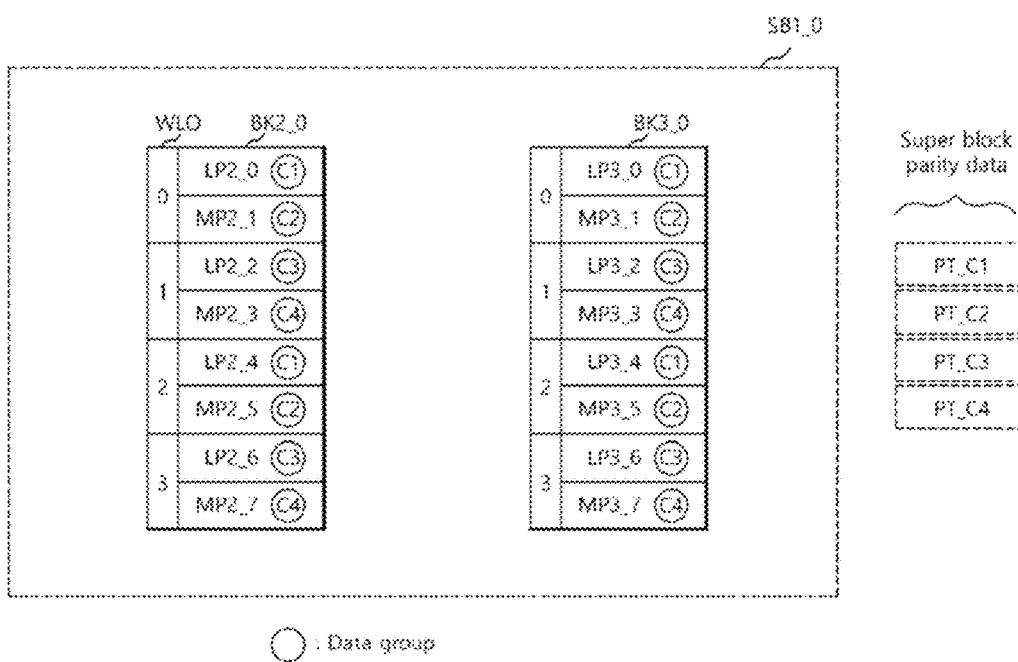

FIGS. 5 and 6 are diagrams illustrating methods of the data storage device 10 for generating super block parity data for the memory regions shown in FIG. 4. FIG. 5 illustrates super block parity data PT_B1 and PT_B2 generated for data chunks to be stored in a super block SB1_0 of FIG. 4, and FIG. 6 illustrates super block parity data PT_C1 to PT_C4.

Referring to FIG. 5, the controller 100 may classify data chunks of the super block SB1_0 into data groups B1 and B2 according to a page type of a page in which a data chunk is to be stored. For example, in the block BK2_0, the controller 100 may classify data chunks to be stored in LSB pages LP2_0, LP2_2, LP2_4 and LP2_6 into the data group B1, and may classify data chunks to be stored in MSB pages MP2_1, MP2_3, MP2_5 and MP2_7 into the data group B2. Even for a block BK3_0, the controller 100 may classify data chunks into the data groups B1 and B2 in the same manner as in the block BK2_0. Table 2.1 schematically shows a reference by which data chunks are classified into the data groups B1 and B2 in the super block SB1_0 according to a page type of a page in which a data chunk is to be stored.

TABLE 2.1

| Page type | Data group |
|---|---|
| LSB page | B1 |
| MSB page | B2 |

The controller 100 may generate the super block parity data PT_B1 and PT_B2 for the data groups B1 and B2, respectively. The controller 100 may store data chunks in the super block SB1_0 and may store the super block parity data PT_B1 and PT_B2 in a parity region predetermined in the storage medium 200.

After the data chunks are stored in the super block SB1_0, when an error bit occurs in the data chunk stored in, for example, the page LP2_0, an error bit occurring in the data chunk stored in the page MP2_1 is highly likely due to the structural characteristic of a nonvolatile memory device. That is to say, the data chunks stored in the pages LP2_0 and MP2_1 corresponding to the same word line may be influenced by each other and may simultaneously include error bits. However, as shown in FIG. 5, when the super block parity data PT_B1 and PT_B2 for the respective data groups B1 and B2 exists, the error bit occurring in the data chunk stored in the page LP2_0 may be corrected by using the other remaining data chunks included in the data group B1 and the super block parity data PT_B1, and the error bit occurring in the data chunk stored in the page MP2_1 may be corrected by using the other remaining data chunks included in the data group B2 and the super block parity data PT_B2.

According to an embodiment, when "m" number of bits are stored in each memory cell and "m" number of page types exist, the controller 100 may classify data chunks into "m" number of data groups according to the "m" number of page types, and may generate "m" number of super block parity data respectively corresponding to the "m" number of data groups.

Referring to FIG. 6, the controller 100 may classify data chunks of the super block SB1_0 into data groups C1 to C4 according to a word line offset and a page type corresponding to a page in which a data chunk is to be stored. For example, in the block BK2_0, the controller 100 may classify data chunks, which are to be stored in the LSB pages LP2_0 and LP2_4 corresponding to an even word line offset, into the data group C1. Also, in the block BK2_0, the controller 100 may classify data chunks, which are to be stored in the MSB pages MP2_1 and MP2_5 corresponding to an even word line offset, into the data group C2. Further, in the block BK2_0, the controller 100 may classify data chunks, which are to be stored in the LSB pages LP2_2 and LP2_6 corresponding to an odd word line offset, into the data group C3. Moreover, in the block BK2_0, the controller 100 may classify data chunks, which are to be stored in the pages MSB MP2_3 and MP2_7 corresponding to an odd word line offset, into the data group C4. Even for the block BK3_0, the controller 100 may classify data chunks into the data groups C1 to C4 in the same manner as in the block BK2_0. Table 2.2 schematically shows a reference by which data chunks are classified into the data groups C1 to C4 in the super block SB1_0, according to a word line offset and a page type of a page in which a data chunk is to be stored.

TABLE 2.2

| Word line offset | Page type | Data group |
|---|---|---|
| Even | LSB page | C1 |
| Even | MSB page | C2 |
| Odd | LSB page | C3 |
| Odd | MSB page | C4 |

The controller 100 may generate the super block parity data PT_C1 to PT_C4 for the data groups C1 to C4, respectively. The controller 100 may store data chunks in the super block SB1_0, and may store the super block parity data PT_C1 to PT_C4 in a parity region predetermined in the storage medium 200.

As shown in FIG. 6 when the super block parity data PT_C1 to PT_C4 exists for the respective data groups C1 to C4, it is possible to correct the error bits simultaneously occurring in respective pages corresponding to adjacent word lines and the error bits simultaneously occurring in respective pages corresponding to the same word line.

According to an embodiment, as described above with reference to FIG. 3, the controller 100 may classify data chunks of the super block SB1_0 into a plurality of data groups according to a word line offset corresponding to a page in which a data chunk is to be stored, and may generate a plurality of super block parity data.

Figure 7:
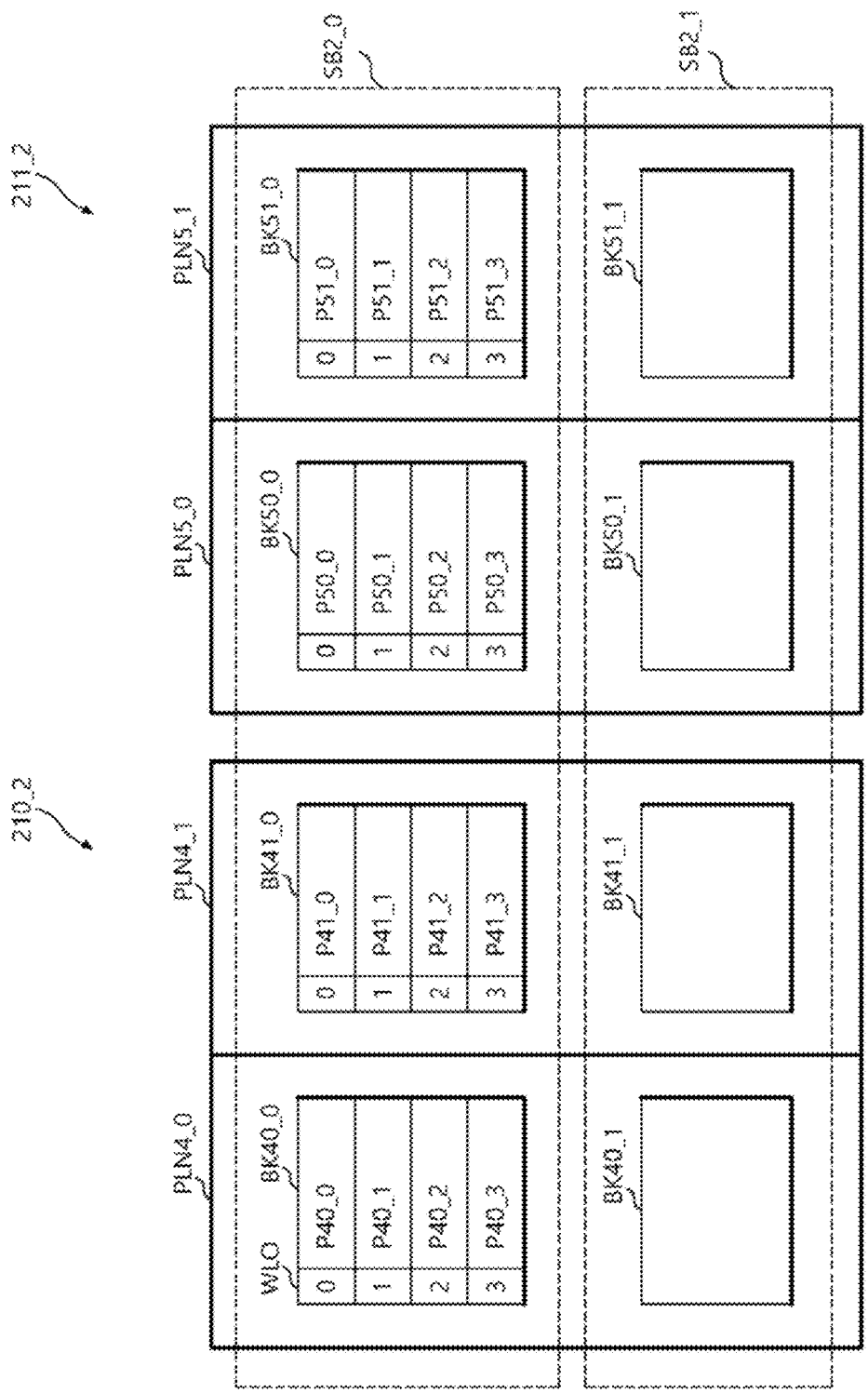
FIG. 7 is a diagram illustrating memory regions of nonvolatile memory devices shown in FIG. 1.

FIG. 7 is a diagram illustrating memory regions of embodiments 210_2 and 211_2 of the nonvolatile memory devices 210 and 211 shown in FIG. 1.

The nonvolatile memory devices 210_2 and 211_2 may include two planes. For example, the nonvolatile memory device 210_2 may include planes PLN4_0 and PLN4_1. In each of the nonvolatile memory devices 210_2 and 211_2, each plane may have a predetermined plane offset. For example, in the nonvolatile memory device 210_2, the plane offset of the plane PLN4_0 may be "0", and the plane offset of the plane PLN4_1 may be "1".

Each plane may include a plurality of blocks. For example, the plane PLN4_0 may include blocks BK40_0 and BK40_1. In each of planes PLN4_0, PLN4_1, PLN5_0 and PLN5_1, each block may have a predetermined block offset. The detailed configuration of each block may be substantially the same as the configuration of the block BK0_0 described above with reference to FIG. 2.

Each of super blocks SB2_0 and SB2_1 may include blocks of the same block offset in the nonvolatile memory devices 210_2 and 211_2. For example, the super block SB2_0 may include blocks BK40_0 and BK41_0 which have the block offset of "0" in the respective planes PLN4_0 and PLN4_1 of the nonvolatile memory device 210_2, and may include blocks BK50_0 and BK51_0 which have the block offset of "0" in the respective planes PLN5_0 and PLN5_1 of the nonvolatile memory device 211_2.

According to an embodiment, each of the nonvolatile memory devices 210_2 and 211_2 may include at least three planes.

Figure 8:
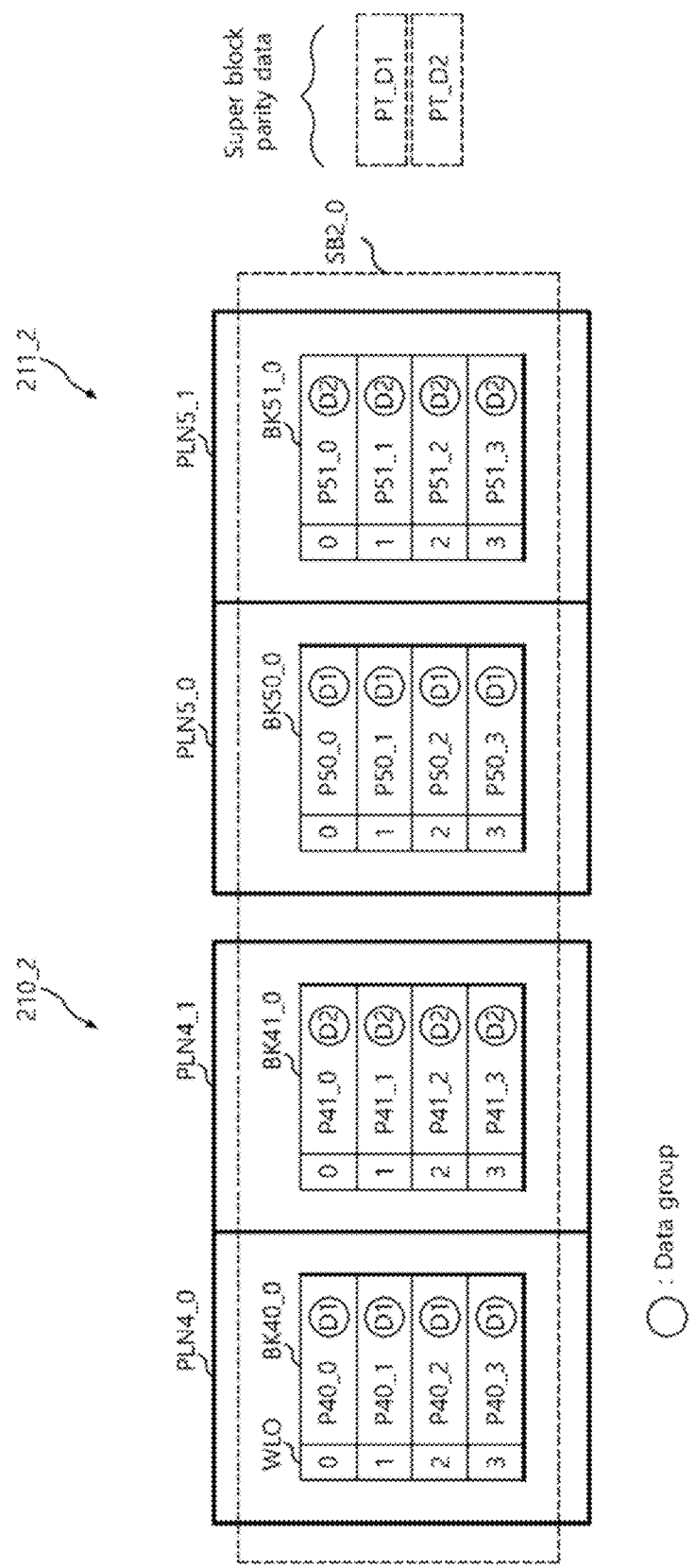
FIGS. 8 and 9 are diagrams illustrating methods of the data storage device for generating super block parity data for the memory regions shown in FIG. 7.
Figure 9:
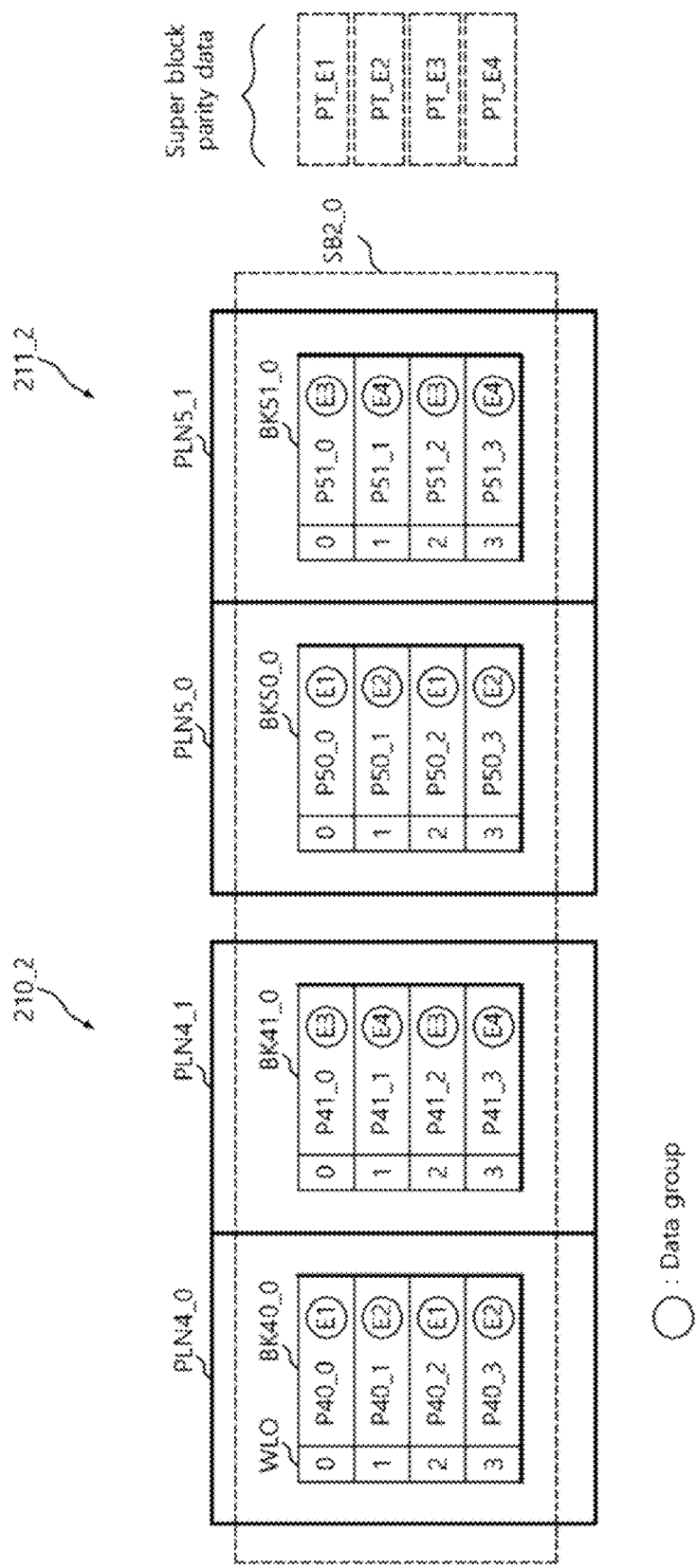

FIGS. 8 and 9 are diagrams illustrating methods of the data storage device 10 for generating super block parity data for the memory regions shown in FIG. 7. FIG. 8 illustrates super block parity data PT_D1 and PT_D2 generated for data chunks to be stored in the super block SB2_0 of FIG. 7, and FIG. 9 illustrates super block parity data PT_E1 to PT_E4.

Referring to FIG. 8, the controller 100 may classify data chunks of the super block SB2_0 into data groups D1 and D2 according to a plane offset corresponding to a page in which a data chunk is to be stored. For example, in the nonvolatile memory device 210_2, the controller 100 may classify data chunks to be stored in pages P40_0 to P40_3 corresponding to the plane offset of "0" Into the data group D1, and may classify data chunks to be stored in pages P41_0 to P41_3 corresponding to the plane offset of "1" into the data group D2. Also, for the nonvolatile memory device 211_2, the controller 100 may classify data chunks into the data groups D1 and D2 in the same manner as in the nonvolatile memory device 210_2. Table 3.1 schematically shows a reference by which data chunks are classified into the data groups D1 and D2 in the super block SB2_0 according to a plane offset corresponding to a page in which a data chunk is to be stored.

TABLE 3.1

| Plane offset | Data group |
|---|---|
| 0 | D1 |
| 1 | D2 |

The controller 100 may generate the super block parity data PT_D1 and PT_D2 for the data groups D1 and D02, respectively. The controller 100 may store data chunks in the super block SB2_0, and may store the super block parity data PT_D1 and PT_D2 in a parity region predetermined in the storage medium 200.

After the data chunks are stored in the super block SB2_0, when an error bit occurs in the data chunk stored in, for example, the page P40_0, an error bit occurring in the data chunk stored in the page P41_0 is highly likely due to the structural characteristic of a nonvolatile memory device. In other words, the data chunks stored in the pages P40_0 and P41_0 corresponding to the same word line offset in the respective planes PLN4_0 and PLN4_1 may simultaneously include error bits, respectively. However, as shown in FIG. 8, when the super block parity data PT_D1 and PT_D2 for the respective data groups D1 and D2 exists, the error bit occurring in the data chunk stored in the page P40_0 may be corrected by using the other remaining data chunks included in the data group D1 and the super block parity data PT_D1, and the error bit occurring in the data chunk stored in the page P41_0 may be corrected by using the other remaining data chunks included in the data group D2 and the super block parity data PT_D2.

According to an embodiment, when a nonvolatile memory device includes "n" number of planes, the controller 100 may classify data chunks into "n" number of data groups according to a plane offset, and may generate "n" number of super block parity data respectively corresponding to the "n" number of data groups.

Referring to FIG. 9, the controller 100 may classify data chunks of the super block SB2_0 into data groups E1 to E4 according to a plane offset and a word line offset corresponding to a page in which a data chunk is to be stored. For example, in the nonvolatile memory device 210_2, the controller 100 may classify data chunks, which are to be stored in the pages P40_0 and P40_2 corresponding to the plane offset of "0" and corresponding to an even word line offset, into the data group E1. Also, in the nonvolatile memory device 210_2, the controller 100 may classify data chunks, which are to be stored in the pages P40_1 and P40_3 corresponding to the plane offset of "0" and corresponding to an odd word line offset, into the data group E2. Further, in the nonvolatile memory device 210_2, the controller 100 may classify data chunks, which are to be stored in the pages P41_0 and P41_2 corresponding to the plane offset of "1" and corresponding to an even word line offset, into the data group E3. Moreover, in the nonvolatile memory device 210_2, the controller 100 may classify data chunks, which are to be stored in the pages P41_1 and P41_3 corresponding to the plane offset of "1" and corresponding to an odd word line offset, into the data group E4. In addition, for the nonvolatile memory device 211_2, the controller 100 may classify data chunks into the data groups E1 to E4 in the same manner as in the nonvolatile memory device 210_2. Table 3.2 schematically shows a reference by which data chunks are classified into the data groups E1 to E4 in the super block SB2_0, according to a plane offset and a word line offset corresponding to a page in which a data chunk is to be stored.

TABLE 3.2

| Plane offset | Word line offset | Data group |
|---|---|---|
| 0 | Even | E1 |
| 0 | Odd | E2 |
| 1 | Even | E3 |
| 1 | Odd | E4 |

The controller 100 may generate the super block parity data PT_E1 to PT_E4 for the data groups E1 to E4, respectively. The controller 100 may store data chunks in the super block SB2_0, and may store the super block parity data PT_E1 to PT_E4 in a parity region predetermined in the storage medium 200.

As shown in FIG. 9, when the super block parity data PT_E1 to PT_E4 exists for the respective data groups E1 to E4, it is possible to correct the error bits simultaneously occurring in respective pages corresponding to the same word line offset and the error bits simultaneously occurring in respective pages corresponding to adjacent word lines.

According to an embodiment, as described above with reference to FIG. 3, the controller 100 may classify data chunks of the super block SB2_0 into a plurality of data groups according to a word line offset of a page in which a data chunk is to be stored, and may generate a plurality of super block parity data.

Figure 10:
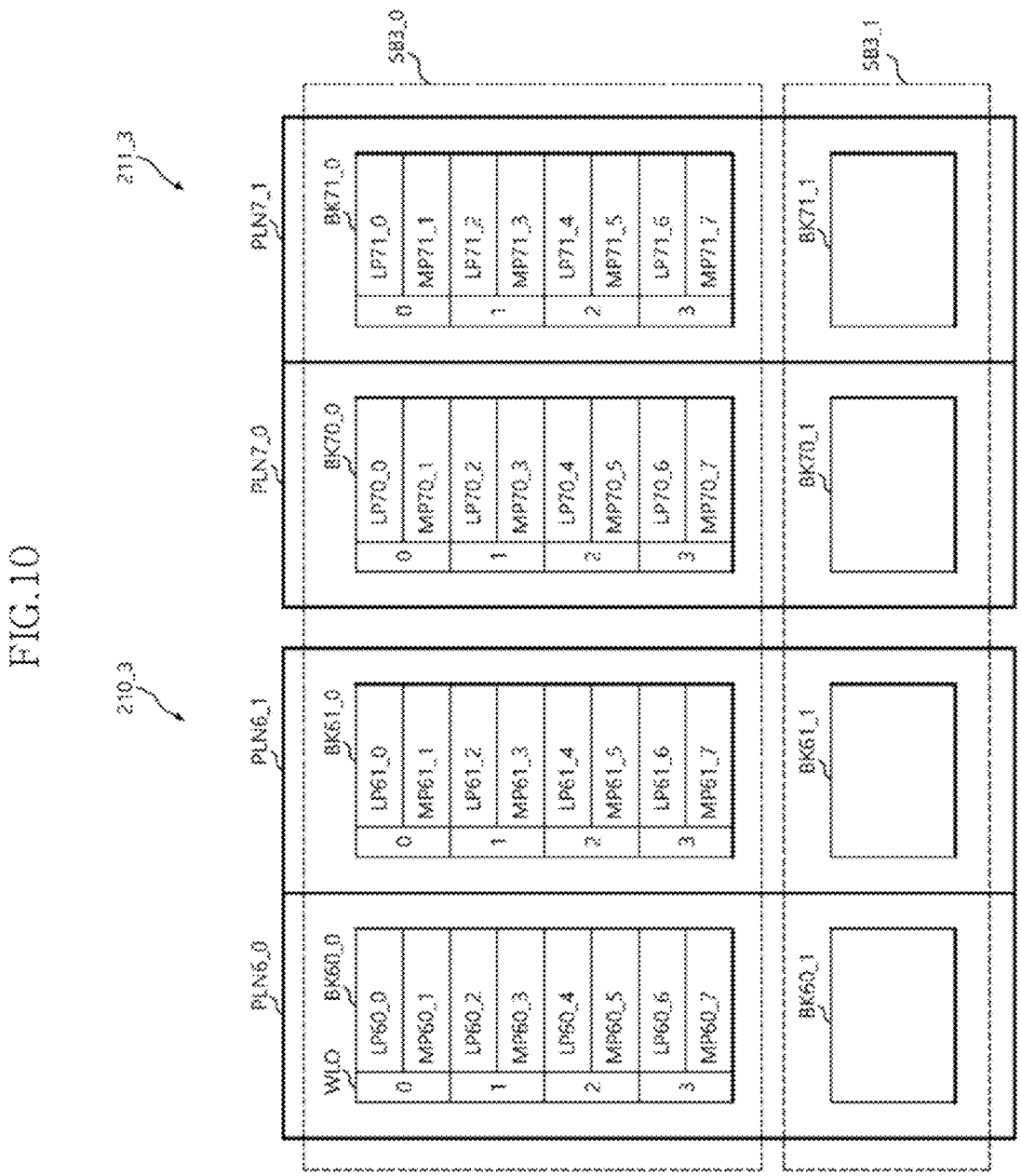
FIG. 10 is a diagram illustrating memory regions of nonvolatile memory devices shown in FIG. 1.

FIG. 10 is a diagram illustrating memory regions of embodiments 210_3 and 211_3 of the nonvolatile memory devices 210 and 211 shown in FIG. 1.

The nonvolatile memory devices 210_3 and 211_3 may be configured substantially similarly to the nonvolatile memory devices 210_2 and 211_2 shown in FIG. 7, except that each memory cell is an MLC.

Each of super blocks SB3_0 and SB3_1 may include blocks which have the same block offset in the nonvolatile memory devices 210_3 and 211_3.

Figure 11:
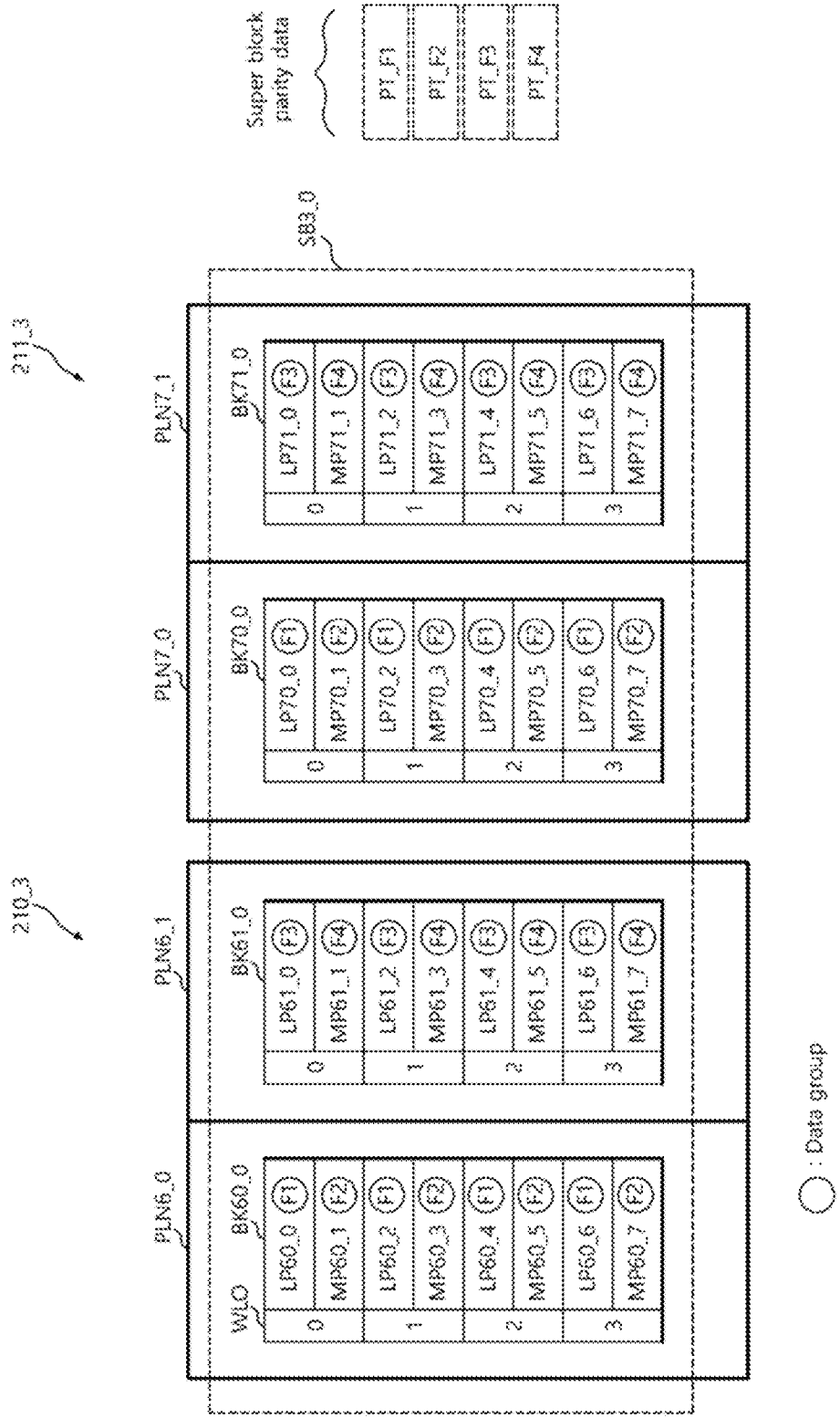
FIGS. 11 and 12 are diagrams illustrating methods of the data storage device for generating super block parity data for the memory regions shown in FIG. 10.
Figure 12:
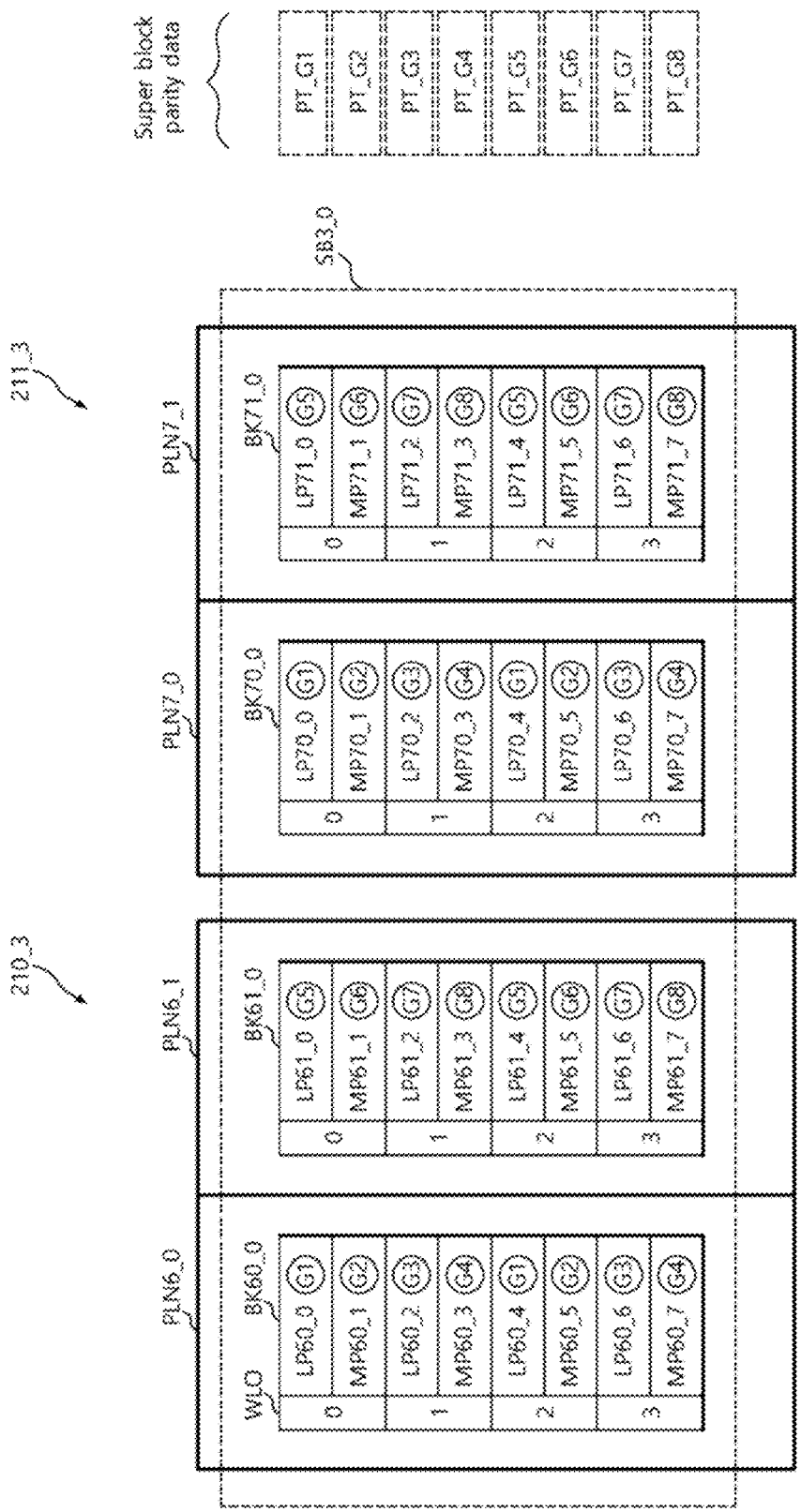

FIGS. 11 and 12 are diagrams illustrating methods of the data storage device 10 for generating super block parity data for the memory regions shown in FIG. 10. FIG. 11 illustrates super block parity data PT_F1 to PT_F4 generated for data chunks to be stored in the super block SB3_0 of FIG. 10, and FIG. 12 illustrates super block parity data PT_G1 to PT_G8.

Referring to FIG. 11, the controller 100 may classify data chunks of the super block SB3_0 into data groups F1 to F4 according to a plane offset and a page type corresponding to a page in which a data chunk is to be stored. For example, in the nonvolatile memory device 210_3, the controller 100 may classify data chunks, which are to be stored in LSB pages LP60_0, LP60_2, LP60_4 and LP60_6 corresponding to the plane offset of "0", into the data group F1. Also, in the nonvolatile memory device 210_3, the controller 100 may classify data chunks, which are to be stored in MSB pages MP60_1, MP60_3, MP60_5 and MP60_7 corresponding to the plane offset of "0", into the data group F2. Further, in the nonvolatile memory device 210_3, the controller 100 may classify data chunks, which are to be stored in LSB pages LP61_0, LP61_2, LP61_4 and LP61_6 corresponding to the plane offset of "1", into the data group F3. Moreover, in the nonvolatile memory device 210_3, the controller 100 may classify data chunks, which are to be stored in MSB pages MP61_1, MP61_3, MP61_5 and MP61_7 corresponding to the plane offset of "1", into the data group F4. Also, for the nonvolatile memory device 211_3, the controller 100 may classify data chunks into the data groups F1 to F4 in the same manner. Table 4.1 schematically shows a reference by which data chunks are classified into the data groups F1 to F4 in the super block SB3_0, according to a plane offset and a page type corresponding to a page in which a data chunk is to be stored.

TABLE 4.1

| Plane offset | Page type | Data group |
|---|---|---|
| 0 | LSB page | F1 |
| 0 | MSB page | F2 |
| 1 | LSB page | F3 |
| 1 | MSB page | F4 |

The controller 100 may generate the super block parity data PT_F1 to PT_F4 for the data groups F1 to F4, respectively. The controller 100 may store data chunks in the super block SB3_0, and may store the super block parity data PT_F1 to PT_F4 in a parity region predetermined in the storage medium 200.

As shown in FIG. 11, when the super block parity data PT_F1 to PT_F4 exists for the respective data groups F1 to F4, it is possible to correct the error bits simultaneously occurring in respective pages corresponding to the same word line offset and the error bits simultaneously occurring in respective pages corresponding to the same word line.

Referring to FIG. 12, the controller 100 may classify data chunks of the super block SB3_0 into data groups G1 to G8 according to a plane offset, a word line offset and a page type corresponding to a page in which a data chunk is to be stored. For example, in the nonvolatile memory device 210_3, the controller 100 may classify data chunks, which are to be stored in the LSB pages LP60_0 and LP60_4 corresponding to the plane offset of "0", corresponding to an even word line offset, into the data group G1. Table 4.2 schematically shows a reference by which data chunks are classified into the data groups G1 to G8 in the super block SB3_0, according to a plane offset, a word line offset and a page type corresponding to a page in which a data chunk is to be stored.

TABLE 4.2

| Plane offset | Word line offset | Page type | Data group |
|---|---|---|---|
| 0 | Even | LSB page | G1 |
| 0 | Even | MSB page | G2 |
| 0 | Odd | LSB page | G3 |
| 0 | Odd | MSB page | G4 |
| 1 | Even | LSB page | G5 |
| 1 | Even | MSB page | G6 |

TABLE 4.2-continued

| Plane offset | Word line offset | Page type | Data group |
|---|---|---|---|
| 1 | Odd | LSB page | G7 |
| 1 | Odd | MSB page | G8 |

The controller 100 may generate the super block parity data PT_G1 to PT_G8 respectively for the data groups G1 to G8. The controller 100 may store data chunks in the super block SB3_0, and may store the super block parity data PT_G1 to PT_G8 in a parity region predetermined in the storage medium 200.

As shown in FIG. 12, when the super block parity data PT_G1 to PT_G8 exists for the respective data groups G1 to G8, it is possible to correct the error bits simultaneously occurring in respective pages corresponding to the same word line offset, the error bits simultaneously occurring in respective pages corresponding to adjacent word lines and the error bits simultaneously occurring in respective pages corresponding to the same word line.

According to an embodiment, the controller 100 may classify data chunks of the super block SB3_0 into a plurality of data groups according to at least one of a plane offset, a word line offset and a page type corresponding to a page in which a data chunk is to be stored, and may generate a plurality of super block parity data.

Figure 13:
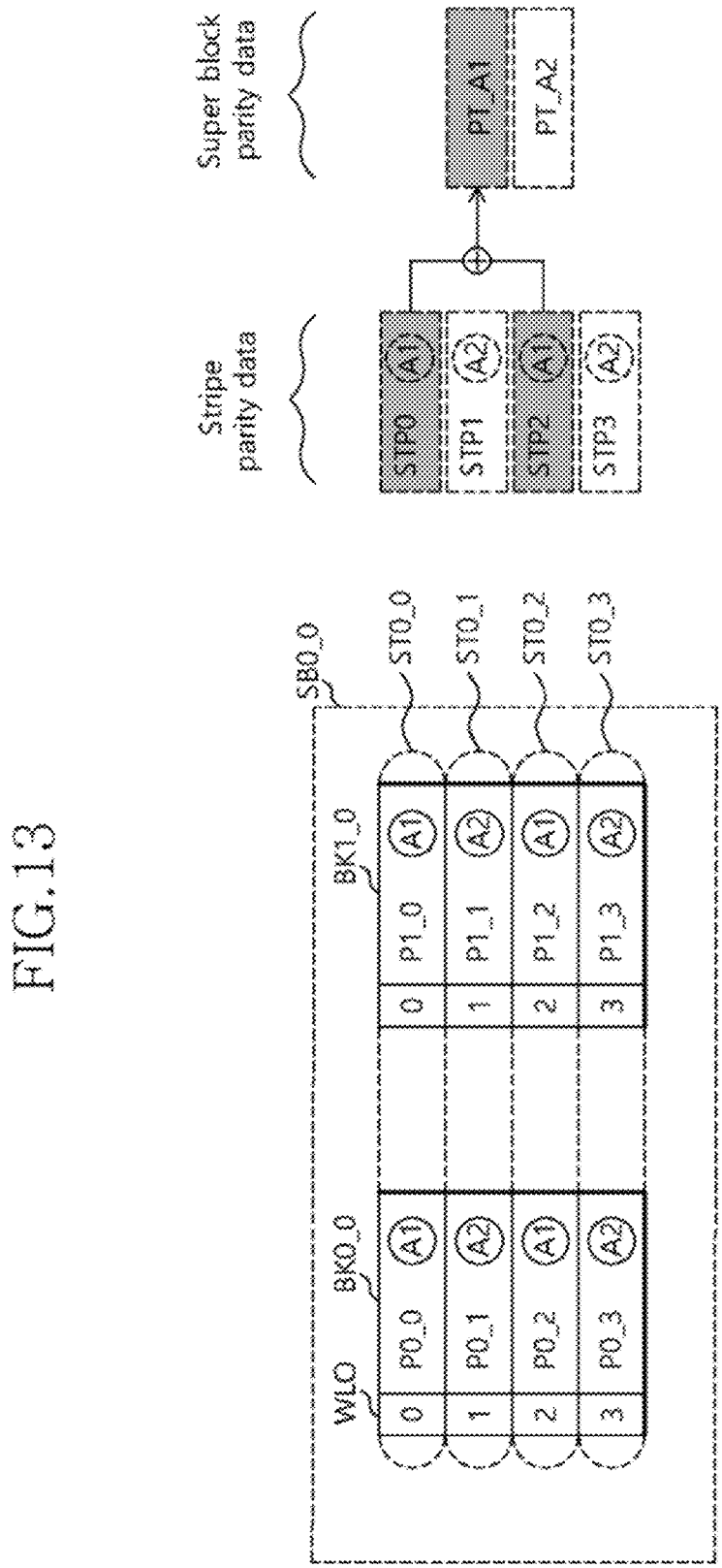
FIG. 13 is a diagram illustrating a method of the data storage device for generating stripe parity data and super block parity data.

FIG. 13 is a diagram illustrating a method of the data storage device 10 for generating the stripe parity data and the super block parity data. FIG. 13 illustrates stripe parity data STP0 to STP3 and super block parity data PT_A1 and PT_A2 generated for data chunks to be stored in the super block SB0_0 of FIG. 2.

Each of stripes ST0_0 to ST0_3 may include pages of the same page offset in the super block SB0_0. For example, the stripe ST0_0 may include pages P0_0 and P1_0 which have the page offset of "0" in the super block SB0_0. When storing data chunks in the super block SB0_0, the controller 100 may sequentially store the data chunks, for example, by the unit of a stripe, starting from the stripe ST0_0.

The controller 100 may generate the stripe parity data STP0 to STP3 for data chunks to be stored in the stripes ST0_0 to ST0_3, respectively. The stripe parity data STP0 to STP3 may be generated for the stripes ST0_0 to ST0_3. For example, the controller 100 may generate the stripe parity data STP0 for data chunks to be stored in the stripe ST0_0. The controller 100 may store data chunks in the stripe ST0_0, and may store the stripe parity data STP0 in a predetermined parity region.

Similarly to super block parity data, stripe parity data may be used to correct an error bit in a data chunk. For example, when an error bit occurs in the data chunk stored in the page P0_0, the controller 100 may read the data chunks stored in the pages P0_0 and P1_0 included in the stripe ST0_0 and the stripe parity data STP0 corresponding to the stripe ST0_0 from the storage medium 200, and may correct the error bit based on the read data chunks and the read stripe parity data STP0.

According to an embodiment, the controller 100 may generate the super block parity data PT_A1 and PT_A2 by using the stripe parity data STP0 to STP3 instead of data chunks to be stored in the super block SB0_0. In other words, by performing a logic operation on a plurality of stripe parity data generated for the data chunks included in the same data group, the controller 100 may generate super block parity data for the corresponding data group. For example, by performing a logic operation on the stripe parity data STP0 and STP2 generated for the data chunks included in a data group A1, the controller 100 may generate the super block parity data PT_A1 for the data group A1.

According to an embodiment, when the stripe parity data STP0 to STP3 are sequentially generated for the respective stripes ST0_0 to ST0_3, only stripe parity data for a predetermined number of stripes which are recently written may be retained. This is because it may be substantially burdensome to continuously manage all the stripe parity data STP0 to STP3 for the respective stripes ST0_0 to ST0_3. Therefore, only stripe parity data for some stripes, which are recently written and error-susceptible to a subsequent write operation, may be retained in the controller 100 or the parity region of the storage medium 200.

According to the embodiment, since super block parity data has a smaller size than stripe parity data, a smaller parity region may be needed. Thus, a burden in terms of storage management may be decreased, and space utilization efficiency may be improved. Also, even though stripe parity data are not retained, since an error bit occurring in a data chunk stored in the storage medium 200 may be corrected through the super block parity data, the reliability of data may be improved.

Figure 14:
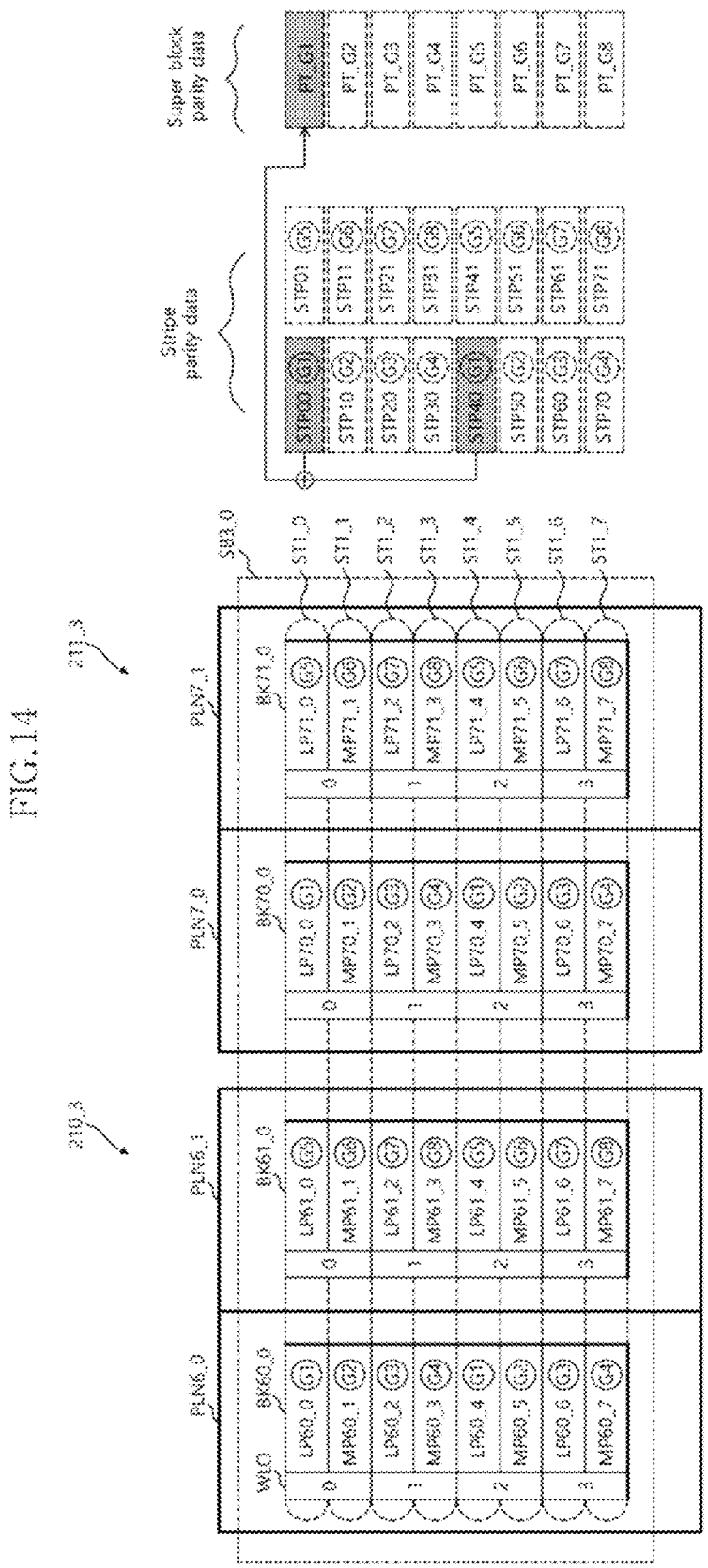
FIG. 14 is a diagram illustrating a method of the data storage device for generating stripe parity data and super block parity data.

FIG. 14 is a diagram illustrating a method of the data storage device 10 for generating the stripe parity data and the super block parity data. FIG. 14 illustrates stripe parity data SPT00 to SPT71 and super block parity data PT_G1 to PT_G8 generated for data chunks to be stored in the super block SB3_0 of FIG. 10.

Referring to FIG. 14, the super block SB3_0 may include stripes ST1_0 to ST1_7. The controller 100 may generate two stripe parity data for each of the stripes ST1_0 to ST1_7. According to a plane offset corresponding to the data chunks included in a stripe, the controller 100 may classify data chunks to be stored in the stripe and may generate stripe parity data. For example, in the stripe ST1_0, the controller 100 may generate the stripe parity data STP00 for data chunks to be stored in pages LP60_0 and LP70_0 corresponding to the plane offset of "0", and may generate the stripe parity data STP01 for data chunks to be stored in pages LP61_0 and LP71_0 corresponding to the plane offset of "1". In this way, when both of the stripe parity data STP00 and STP01 exist for the stripe ST1_0, it is possible to correct the error bits simultaneously occurring in the respective data chunks stored in pages, for example, the pages LP60_0 and LP61_0 corresponding to the same word line offset.

According to an embodiment, the controller 100 may generate the super block parity data PT_G1 to PT_G8 by using the stripe parity data STP00 to STP71 instead of data chunks to be stored in the super block SB3_0. For example, by performing a logic operation on the stripe parity data STP00 and STP40 generated for the data chunks included in a data group G1, the controller 100 may generate the super block parity data PT_G1 for the data group G1.

FIGS. 15a to 15d are diagrams illustrating methods of the controller 100 for generating the super block parity data. In FIGS. 15a to 15d, as described above with reference to FIG. 3, the controller 100 may classify data chunks of the super block SB0_0 into data groups A1 and A2 according to a word line offset WLO corresponding to a page in which a data chunk is to be stored, and may generate super block parity data PT_A1 and PT_A2.

To generate the super block parity data PT_A1 for the data group A1, the controller 100 may include a storage section 111 for storing a result of performing a logic operation (e.g., an exclusive OR logic operation) on the data chunks included in the data group A1. Also, to generate the super block parity data PT_A2 for the data group A2, the controller 100 may include a storage section 112 for storing a result of performing a logic operation (e.g., an exclusive OR logic operation) on the data chunks included in the data group A2.

According to an embodiment, the number of storage sections to be included in the controller 100 may depend on the number of super block parity data to be generated.

Figure 15A:
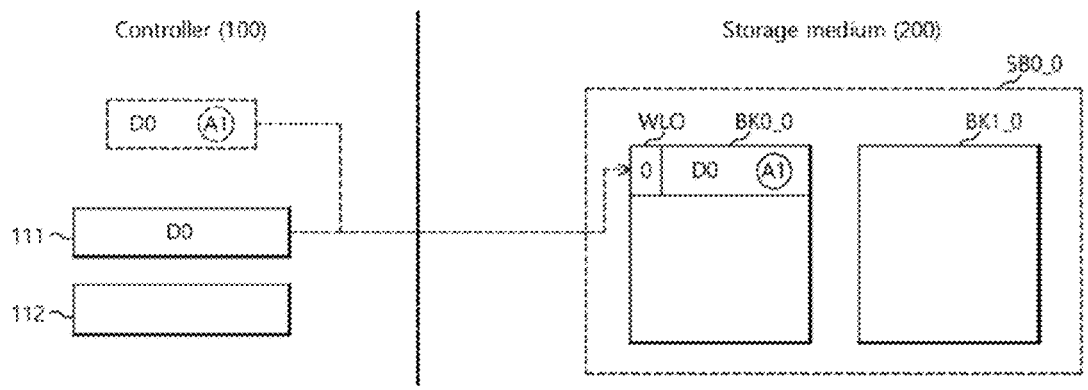
FIGS. 15a, 15b, 15c, and 15d are diagrams illustrating methods of a controller for generating super block parity data.

Referring to FIG. 15a, the controller 100 may classify a data chunk D0 to be stored in the super block SB0_0 into the data group A1 according to the word line offset WLO corresponding to a page in which the data chunk D0 is to be stored. The controller 100 may store the data chunk D0 in the storage section 111. The controller 100 may store the data chunk D0 in the super block SB0_0.

Figure 15B:
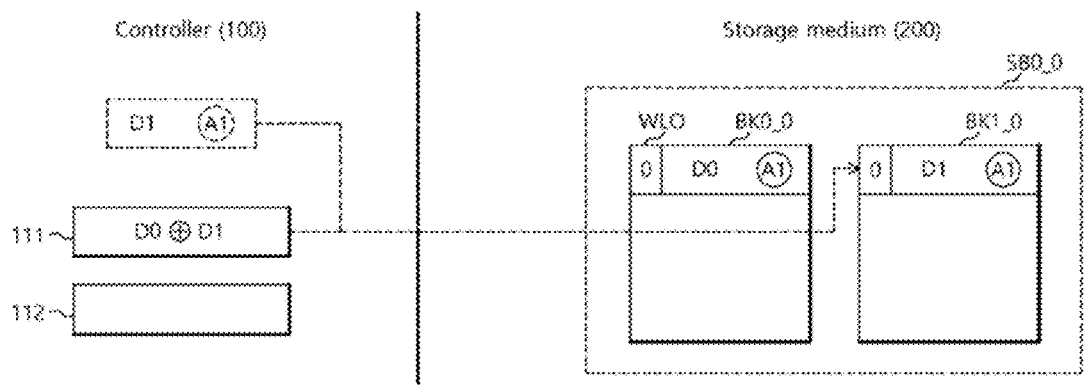

Referring to FIG. 15b, the controller 100 may classify a data chunk D1 to be stored in the super block SB0_0 into the data group A1 according to the word line offset WLO corresponding to a page in which the data chunk D1 is to be stored. The controller 100 may perform a logic operation on the data chunk D0 and the data chunk D1, and may store a result of the logic operation in the storage section 111. The controller 100 may store the data chunk D1 in the super block SB0_0.

Figure 15C:
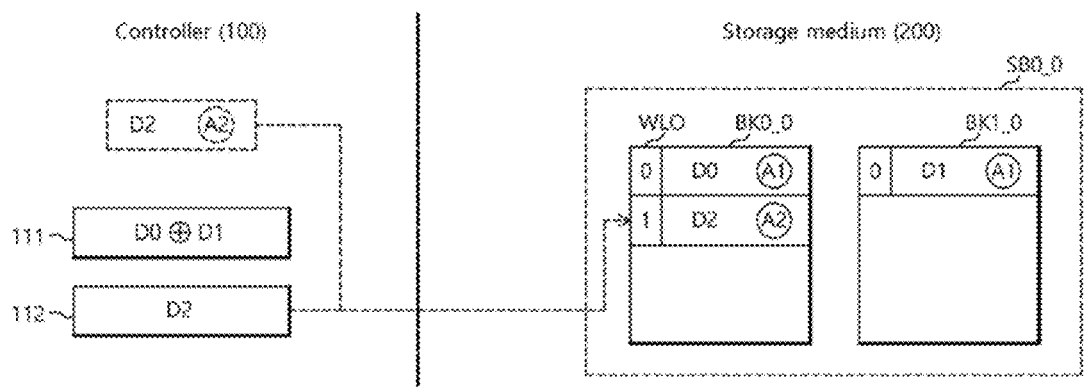

Referring to FIG. 15c, the controller 100 may classify a data chunk D2 to be stored in the super block SB0_0 into the data group A2 according to the word line offset WLO corresponding to a page in which the data chunk D2 is to be stored. The controller 100 may store the data chunk D2 in the storage section 112. The controller 100 may store the data chunk D2 in the super block SB0_0.

Figure 15D:
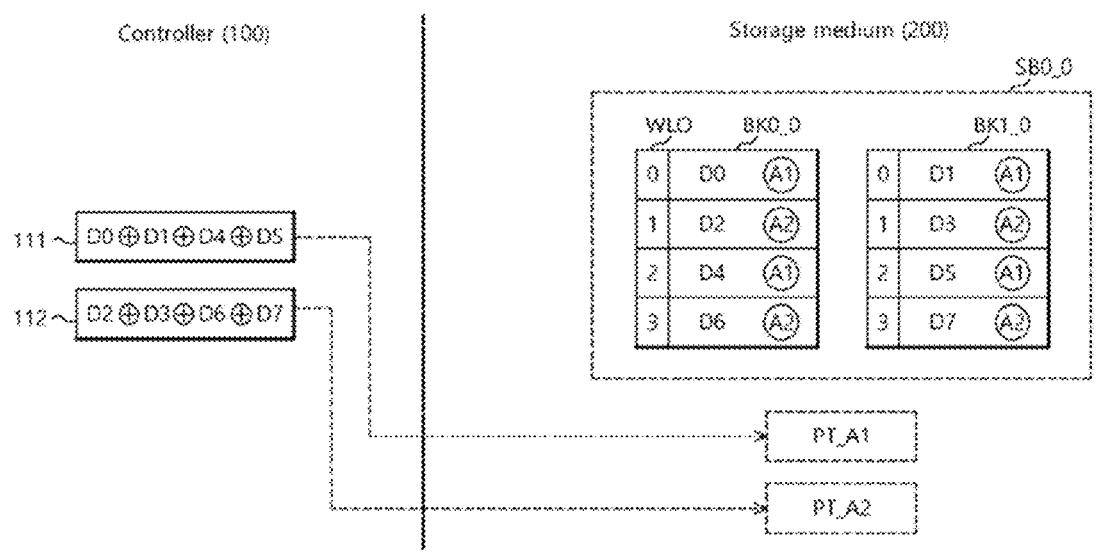

Referring to FIG. 15d, the controller 100 may classify data chunks D3 to D7 into the data groups A1 and A2, may perform logic operations according to the classifications, and may store results of the logic operation in the storage sections 111 and 112. When the super block SB0_0 is full of data chunks, the controller 100 may store the logic operation results stored in the storage sections 111 and 112 as the super block parity data PT_A1 and PT_A2 in a predetermined parity region of the storage medium 200.

While not shown, the controller 100 may generate also stripe parity data in substantially the same way as described above with reference to FIGS. 15a to 15d. The controller 100 may further include storage sections corresponding to the stripe parity data.

Figure 16:
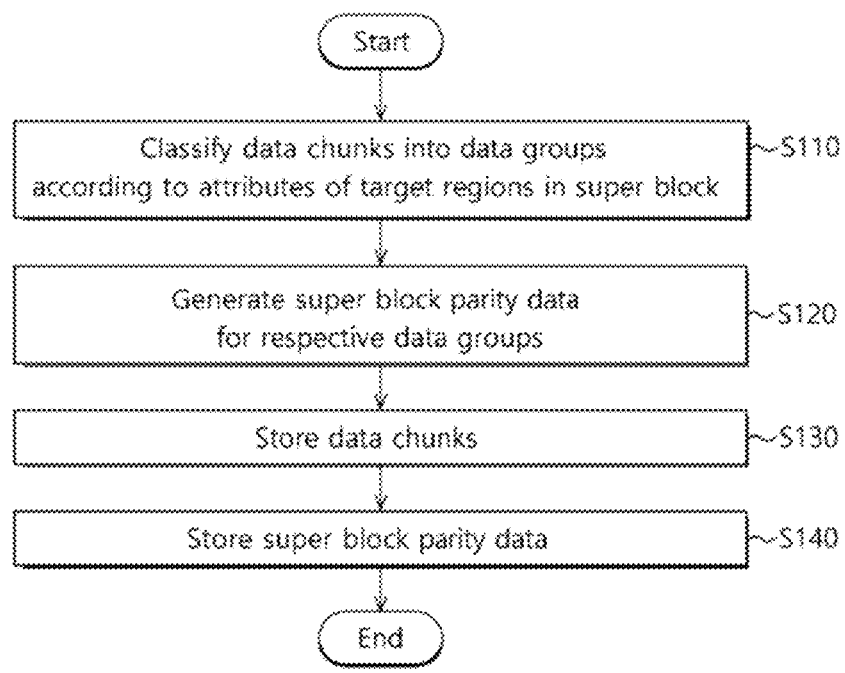
FIG. 16 is a flow chart illustrating a method for operating a data storage device in accordance with an embodiment.

FIG. 16 is a flow chart illustrating a method for operating the data storage device 10 in accordance with an embodiment. FIG. 16 shows a method of the data storage device 10 for generating the super block parity data.

At step S110, the controller 100 may classify a plurality of data chunks of a super block into a plurality of data groups according to an attribute of target regions of the super block in which the plurality of data chunks are to be stored. The attribute of the target regions may be at least one among a plane offset, a word line offset, a page offset and a page type.

At step S120, the controller 100 may generate super block parity data for the plurality of respective data groups. The controller 100 may generate corresponding super block parity data by performing a logic operation on the data chunks classified into the same data group.

At step S130, the controller 100 may store the plurality of data chunks in the super block. The controller 100 may store the data chunks, to which a logic operation for generating super block parity data has been performed, in the super block.

At step S140, the controller 100 may store the super block parity data in the parity region of the storage medium 200.

Figure 17:
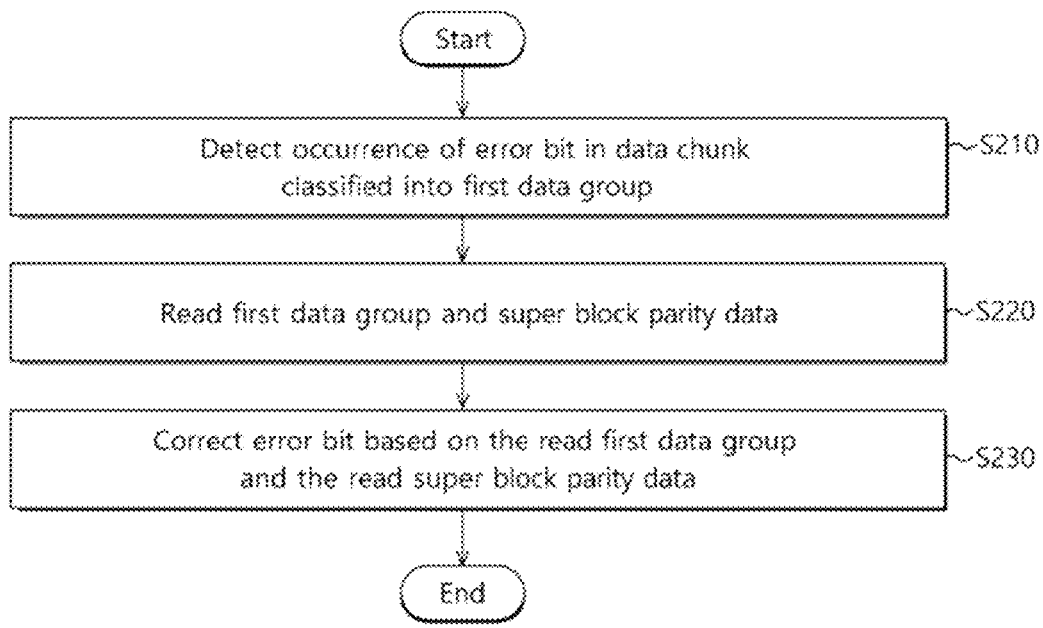
FIG. 17 is a flow chart illustrating a method for operating a data storage device in accordance with an embodiment.

FIG. 17 is a flow chart illustrating a method for operating the data storage device 10 in accordance with an embodiment. FIG. 17 shows a method of the data storage device 10 for correcting an error bit of the stored data chunk through the super block parity data.

At step S210, the controller 100 may detect that an error bit in a data chunk classified into a first data group among the plurality of data groups. For example, the controller 100 may detect an error bit in a data chunk when reading the data chunk stored in the storage medium 200.

At step S220, the controller 100 may read the data chunks classified into the first data group and the super block parity data generated for the first data group from the storage medium 200. The controller 100 may read the other remaining data chunks other than the data chunk having the error bit from the storage medium 200.

At step S230, the controller 100 may correct the error bit based on the read first data group and the read super block parity data.

Figure 18:
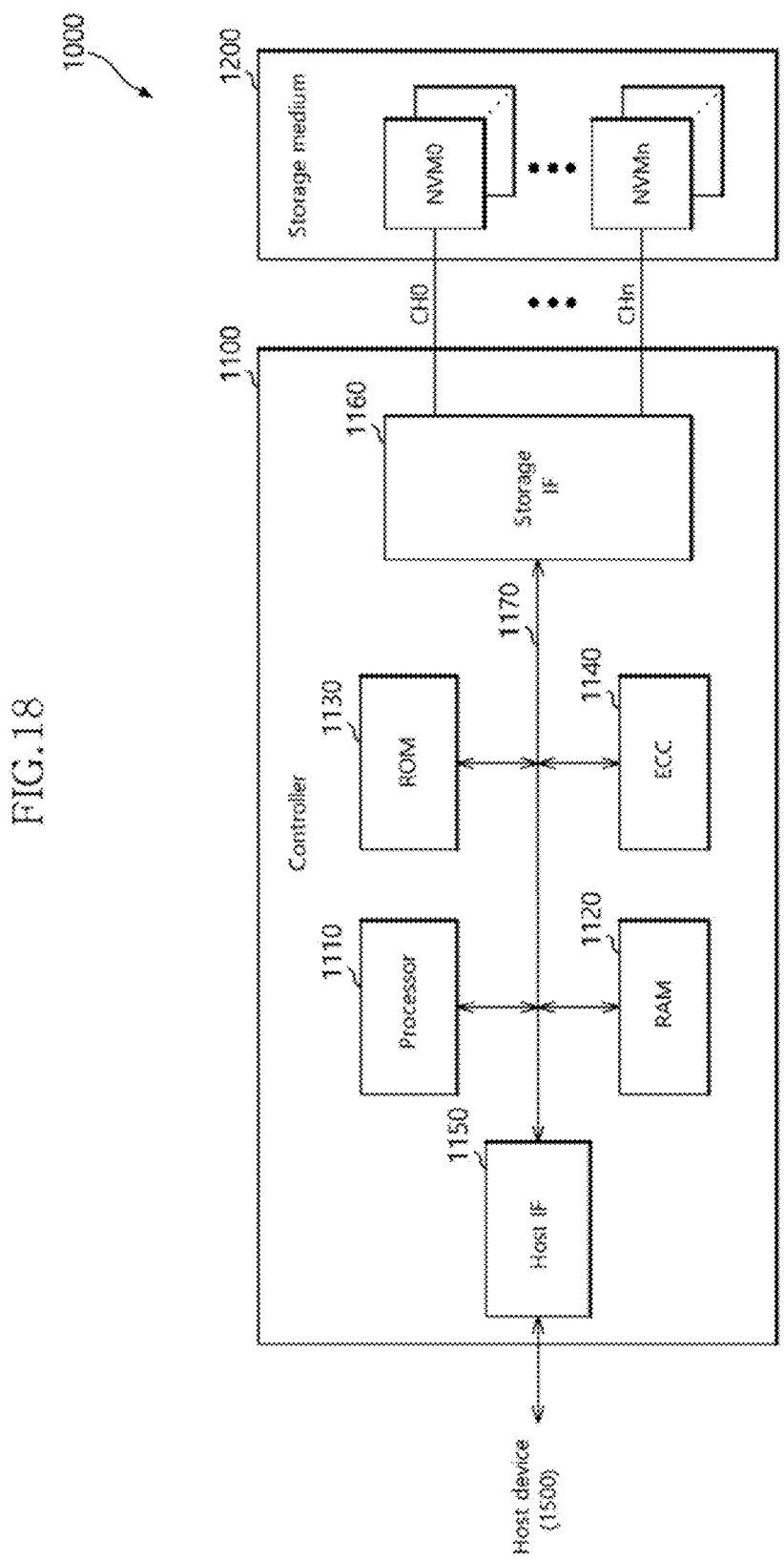
FIG. 18 is a block diagram illustrating a solid state drive in accordance with an embodiment.

FIG. 18 is a block diagram illustrating a solid state drive (SSD) 1000 in accordance with an embodiment.

The SSD 1000 may include an SSD controller 1100 and a storage medium 1200.

The SSD controller 1100 may control the data exchange between a host device 1500 and the storage medium 1200. The SSD controller 1100 may operate in a manner substantially similar to the controller 100 of FIG. 1. The SSD controller 1100 may include a processor 1110, a RAM 1120, a ROM 1130, an ECC unit 1140, a host interface unit 1150, and a storage interface unit 1160.

The processor 1110 may control the general operations of the SSD controller 1100. The processor 1110 may store data in the storage medium 1200 and read stored data from the storage medium 1200 according to requests from the host device 1500. In order to efficiently manage the storage medium 1200, the processor 1110 may control the Internal operations of the SSD 1000 such as a merge operation, a wear leveling operation, and so forth.

The RAM 1120 may store programs and program data to be used by the processor 1110. The RAM 1120 may temporarily store the data transmitted from the host interface unit 1150 before transferring it to the storage medium 1200, and may temporarily store the data transmitted from the storage medium 1200 before transferring it to the host device 1500.

The ROM 1130 may store program codes to be read by the processor 1110. The program codes may include commands to be processed by the processor 1110 for the processor 1110 to control the internal units of the SSD controller 1100.

The ECC unit 1140 may encode data to be stored in the storage medium 1200, and may decode the data read from the storage medium 1200. The ECC unit 1140 may detect and correct an error occurring in data, according to an ECC algorithm.

The host interface unit 1150 may exchange requests, data, etc., with the host device 1500.

The storage interface unit 1160 may transmit control signals and data to the storage medium 1200. The storage interface unit 1160 may be transmitted with data from the storage medium 1200. The storage interface unit 1160 may be electrically coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may store data chunks and super block parity data according to the control of the SSD controller 1100, similar to the nonvolatile memory devices 210 and 211 shown in FIG. 1.

Figure 19:
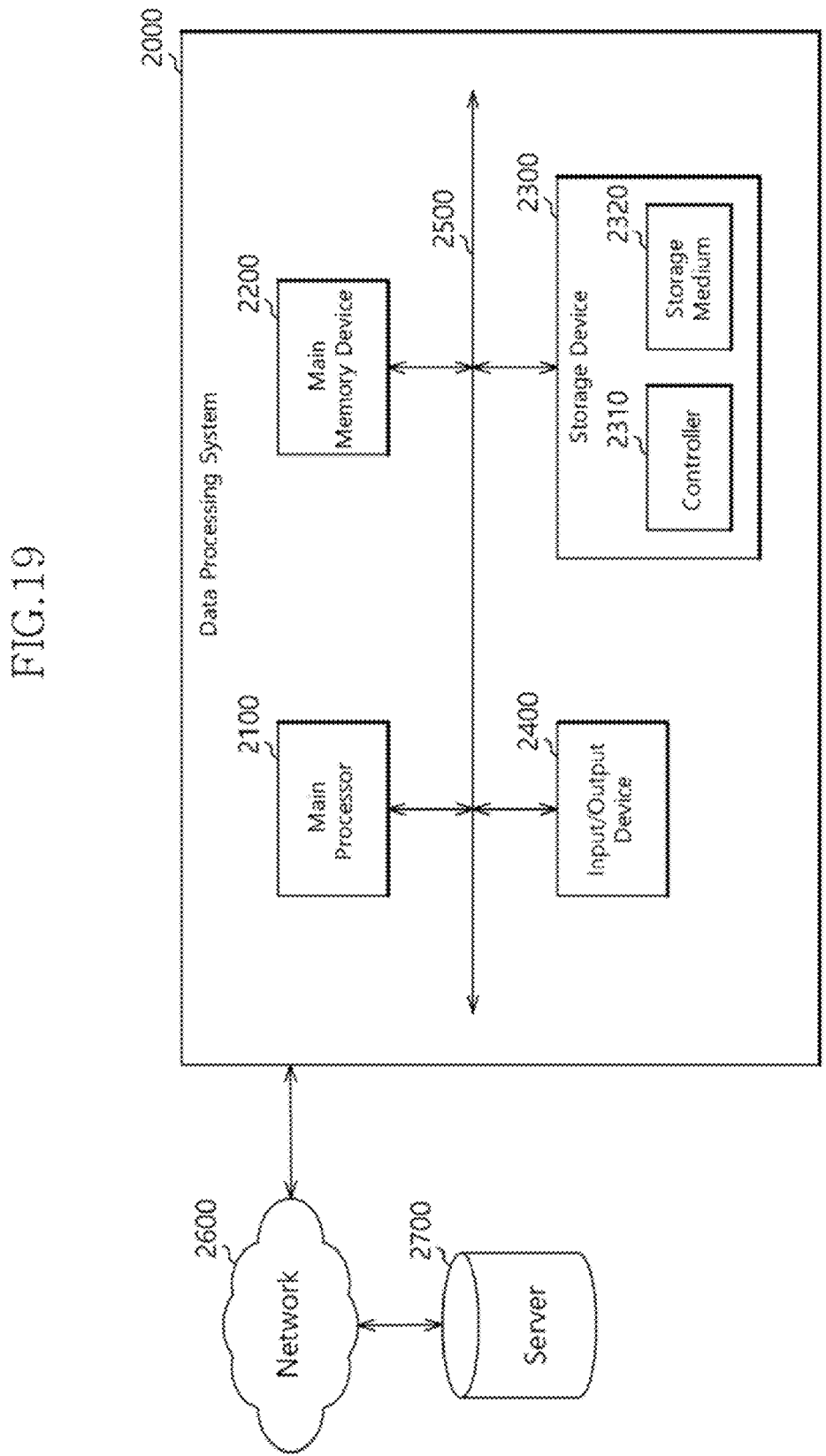
FIG. 19 is a block diagram illustrating a data processing system including the data storage device.

FIG. 19 is a block diagram illustrating a data processing system 2000 including the data storage device 10.

The data processing system 2000 may include a computer, a laptop, a netbook, a smart phone, a digital TV, a digital camera, a navigator, etc. The data processing system 2000 may include a main processor 2100, a main memory device 2200, a memory device 2300, and an input/output device 2400. The internal units of the data processing system 2000 may exchange data, control signals, etc., through a system bus 2500.

The main processor 2100 may control the general operations of the data processing system 2000. The main processor 2100 may be, for example, a central processing unit, such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the memory device 2300 and the input/output device 2400.

The memory device 2300 may include a memory controller 2310 and a storage medium 2320. The memory device 2300 may be configured and operate in substantially the same way as the data storage device 10 shown in FIG. 1.

The input/output device 2400 may include a keyboard, a scanner, a touch screen, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface unit (not shown) to access the network 2600.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a plurality of nonvolatile memory devices including a plurality of blocks, the plurality of blocks including a plurality of pages accessed through a plurality of word lines, each of the plurality of word lines corresponding to at least a Least Significant Bit (LSB) page and a Most Significant Bit (MSB) page; and
   a controller suitable for storing a plurality of data chunks in the plurality of pages, generating first super block parity data for data chunks stored in LSB pages corresponding to even word lines of the plurality of word lines, generating second super block parity data for data chunks stored in MSB pages corresponding to the even word lines, generating third super block parity data for data chunks stored in LSB pages corresponding to odd word lines of the plurality of word lines, and generating forth super block parity data for data chunks stored in MSB pages corresponding to the odd word lines,
   wherein the controller includes memories corresponding to different attributes of the plurality of pages, classifies an attribute of a data chunk of the plurality of data chunks as one of the attributes depending on an attribute of a page in which the data chunk is stored, and generates super block parity data regarding the data chunk by calculating new super block parity data based on the data chunk and super block parity data pre-stored in a memory corresponding to the attribute of the data chunk and storing the new super block parity data in the memory.

2. The data storage device according to claim 1, wherein the controller classifies the plurality of data chunks into a plurality of data groups according to an attribute of the plurality of pages, and generates super block parity data for the plurality of respective data groups.

3. The data storage device according to claim 2, wherein the controller corrects an error bit of one of the data chunks classified as a first one of the plurality of data groups based on the other data chunks classified as the first data group and one of the super block parity data for the first data group.

4. The data storage device according to claim 1,
wherein the controller generates stripe parity data corresponding to a plurality of stripes, each of the plurality of stripes includes pages having a same page offset among the plurality of pages in which the plurality of data chunks are stored.

5. The data storage device according to claim 4, wherein the controller generates the first to the forth super block parity data based on the stripe parity data.

6. A data storage device comprising:
a plurality of nonvolatile memory devices including a plurality of blocks, the plurality of blocks including a plurality of pages accessed through a plurality of word lines, each of the plurality of word lines corresponding to at least a Least Significant Bit (LSB) page and a Most Significant Bit (MSB) page, each of the plurality of nonvolatile memory devices including a first plane including a first block of the plurality of blocks and a second plane including a second block of the plurality of blocks; and
a controller suitable for storing a plurality of data chunks in the plurality of pages, generating first super block parity data for data chunks stored in LSB pages of first planes, generating second super block parity data for data chunks stored in MSB pages of the first planes, generating third super block parity data for data chunks stored in LSB pages of second planes, and generating forth super block parity data for data chunks stored in MSB pages of the second planes,
wherein the controller includes memories corresponding to different attributes of the plurality of pages, classifies an attribute of a data chunk of the plurality of data chunks as one of the attributes depending on an attribute of a page in which the data chunk is stored, and generates super block parity data regarding the data chunk by calculating new super block parity data based on the data chunk and super block parity data pre-stored in a memory corresponding to the attribute of the data chunk and storing the new super block parity data in the memory.

7. The data storage device according to claim 6, wherein the controller classifies the plurality of data chunks into a plurality of data groups according to an attribute of the plurality of pages, and generates super block parity data for the plurality of respective data groups.

8. The data storage device according to claim 7, wherein the controller corrects an error bit of one of the data chunks classified as a first one of the plurality of data groups based on the other data chunks classified as the first data group and one of the super block parity data for the first data group.

9. The data storage device according to claim 6, wherein the controller generates stripe parity data corresponding to a plurality of stripes, each of the plurality of stripes includes pages having a same page offset among the plurality of pages in which the plurality of data chunks are stored.

10. The data storage device according to claim 9, wherein the controller generates the first to the forth super block parity data based on the stripe parity data.

11. A data storage device comprising:
a plurality of nonvolatile memory devices including a plurality of blocks, the plurality of blocks including a plurality of pages accessed through a plurality of word lines, each of the plurality of nonvolatile memory devices including a first plane including a first block of the plurality of blocks and a second plane including a second block of the plurality of blocks; and
a controller suitable for storing a plurality of data chunks in the plurality of pages, generating first super block parity data for data chunks stored in pages corresponding to even word lines of first planes, generating second super block parity data for data chunks stored in pages corresponding to odd word lines of the first planes, generating third super block parity data for data chunks stored in pages corresponding to even word lines of second planes, and generating forth super block parity data for data chunks stored in pages corresponding to odd word lines of the second planes,
wherein the controller includes memories corresponding to different attributes of the plurality of pages, classifies an attribute of a data chunk of the plurality of data chunks as one of the attributes depending on an attribute of a page in which the data chunk is stored, and generates super block parity data regarding the data chunk by calculating new super block parity data based on the data chunk and super block parity data pre-stored in a memory corresponding to the attribute of the data chunk and storing the new super block parity data in the memory.

12. The data storage device according to claim 11, wherein the controller classifies the plurality of data chunks into a plurality of data groups according to an attribute of the plurality of pages, and generates super block parity data for the plurality of respective data groups.

13. The data storage device according to claim 12, wherein the controller corrects an error bit of one of the data chunks classified as a first one of the plurality of data groups based on the other data chunks classified as the first data group and one of the super block parity data for the first data group.

14. The data storage device according to claim 11,
wherein the controller generates stripe parity data corresponding to a plurality of stripes, each of the plurality of stripes includes pages having a same page offset among the plurality of pages in which the plurality of data chunks are stored.

15. The data storage device according to claim 14, wherein the controller generates the first to the forth super block parity data based on the stripe parity data.

* * * * *